(12) United States Patent
Abbasi et al.

(10) Patent No.: US 11,824,273 B2
(45) Date of Patent: Nov. 21, 2023

(54) MINIMIZING IMPEDANCE VARIATION DURING PASSIVE PHASE SHIFTING

(71) Applicant: Renesas Electronics America Inc., Milpitas, CA (US)

(72) Inventors: Morteza Abbasi, Carlsbad, CA (US); Tumay Kanar, Carlsbad, CA (US); Naveen Krishna Yanduru, San Diego, CA (US)

(73) Assignee: Renesas Electronics America Inc., Milpitas, CA (US)

(*) Notice: Subject to any disclaimer, the term of this patent is extended or adjusted under 35 U.S.C. 154(b) by 428 days.

(21) Appl. No.: 16/683,472

(22) Filed: Nov. 14, 2019

(65) Prior Publication Data

US 2021/0151878 A1 May 20, 2021

(51) Int. Cl.
| | | |
|---|---|---|
| *H01Q 3/38* | (2006.01) | |
| *H03H 7/20* | (2006.01) | |
| *H01Q 3/26* | (2006.01) | |
| *H04B 1/40* | (2015.01) | |
| *H03H 2/00* | (2006.01) | |
| *H03H 7/19* | (2006.01) | |
| *H03H 7/38* | (2006.01) | |
| *H01Q 21/22* | (2006.01) | |

(52) U.S. Cl.
CPC ............ *H01Q 3/2694* (2013.01); *H01Q 3/38* (2013.01); *H03H 2/005* (2013.01); *H03H 7/19* (2013.01); *H03H 7/20* (2013.01); *H03H 7/38* (2013.01); *H04B 1/40* (2013.01); *H01Q 21/22* (2013.01)

(58) Field of Classification Search
CPC ........ H01Q 3/2694; H01Q 3/38; H01Q 21/22; H01Q 3/36; H03H 2/005; H03H 7/19; H03H 7/38; H03H 7/20; H04B 1/40; H04B 1/48
See application file for complete search history.

(56) References Cited

U.S. PATENT DOCUMENTS

| | | | | |
|---|---|---|---|---|
| 6,356,149 | B1 * | 3/2002 | Stengel | H03F 1/0288 |
| | | | | 333/139 |
| 8,789,003 | B1 * | 7/2014 | Ding | G06F 30/36 |
| | | | | 716/136 |
| 10,476,157 | B1 * | 11/2019 | Segoria | H03H 7/20 |
| 2014/0152399 | A1 * | 6/2014 | Ehyaie | H03H 7/185 |
| | | | | 333/139 |
| 2014/0315500 | A1 * | 10/2014 | Ding | H01P 1/184 |
| | | | | 455/77 |
| 2015/0070242 | A1 * | 3/2015 | Kawai | H03F 3/24 |
| | | | | 333/177 |

(Continued)

FOREIGN PATENT DOCUMENTS

| | | | |
|---|---|---|---|
| DE | 102014102699 | * | 9/2015 |
| EP | 1496614 A1 | * | 1/2005 |

*Primary Examiner* — Patrick O Neill
(74) *Attorney, Agent, or Firm* — SCULLY, SCOTT, MURPHY & PRESSER, P.C.

(57) ABSTRACT

An apparatus includes a plurality of transceiver circuits, each comprising one or more phase shifter circuits. The phase shifter circuits may be configured to make a phase change by switching at least one of a capacitance value and an inductance value in response to a control signal. A characteristic impedance and the phase of each phase shifter circuit are correlated such that after the phase change, a value of the characteristic impedance is maintained at a predefined value.

11 Claims, 22 Drawing Sheets

(56) References Cited

U.S. PATENT DOCUMENTS

2015/0270821 A1* 9/2015 Natarajan ............... H03H 7/20
455/78
2020/0381825 A1* 12/2020 Rostomyan ............. H01F 21/02

* cited by examiner

MINIMIZING IMPEDANCE VARIATION DURING PASSIVE PHASE SHIFTING

FIELD OF THE INVENTION

The invention relates to transceiver circuits generally and, more particularly, to a method and/or apparatus for minimizing impedance variation during passive phase shifting.

BACKGROUND

An inductance-capacitance (LC) network exhibits the same behavior as a transmission line over a narrow frequency range. Characteristic impedance and electrical length of the transmission line are determined by values of inductance (L) and capacitance (C). In conventional implementations, when the phase is changed by switching capacitor or inductor values, the characteristic impedance changes as well, causing variation in input and output impedances.

It would be desirable to implement a method and/or apparatus for minimizing impedance variation during passive phase shifting.

SUMMARY

The invention concerns an apparatus including a plurality of transceiver circuits, each comprising one or more phase shifter circuits. The phase shifter circuits may be configured to make a phase change by switching at least one of a capacitance value and an inductance value in response to a control signal. A characteristic impedance and the phase of each phase shifter circuit is correlated such that after the phase change, a value of the characteristic impedance is maintained at a predefined value.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a method and/or apparatus for minimizing impedance variation during passive phase shifting that may (i) implement a bidirectional, linear, and passive circuit topology, (ii) be implemented in a compact footprint suitable for, but not limited to integrated circuit (IC) technologies, (iii) be implemented in complex transceiver, phased array, and measurements systems, (iv) provide a method to derive values of circuit elements to perform accurate phase shifting without affecting input and output port impedances and/or amplitude variations on a transmitted signal, (v) be scalable to any amount of phase shift, group delay shift, impedance level, center frequency, and/or bandwidth, (vi) be scalable for any number of phase states and any arbitrary phase resolution, (vii) be implemented in single-ended and differential formats, (viii) absorb parasitic capacitances of other active circuit elements, especially switches, to avoid unwanted frequency, bandwidth, and other performance limitations, (ix) be particularly suited for, but not limited to, silicon, CMOS, FET, and/or HEMT technologies, (x) utilize an inductor with switched capacitors to provide a desired phase shift, (xi) utilize a capacitor with switched inductors to provide the desired phase shift, and/or (xii) assure substantially constant input and output impedances and transmission loss of a network over different phase states.

Figure 1:
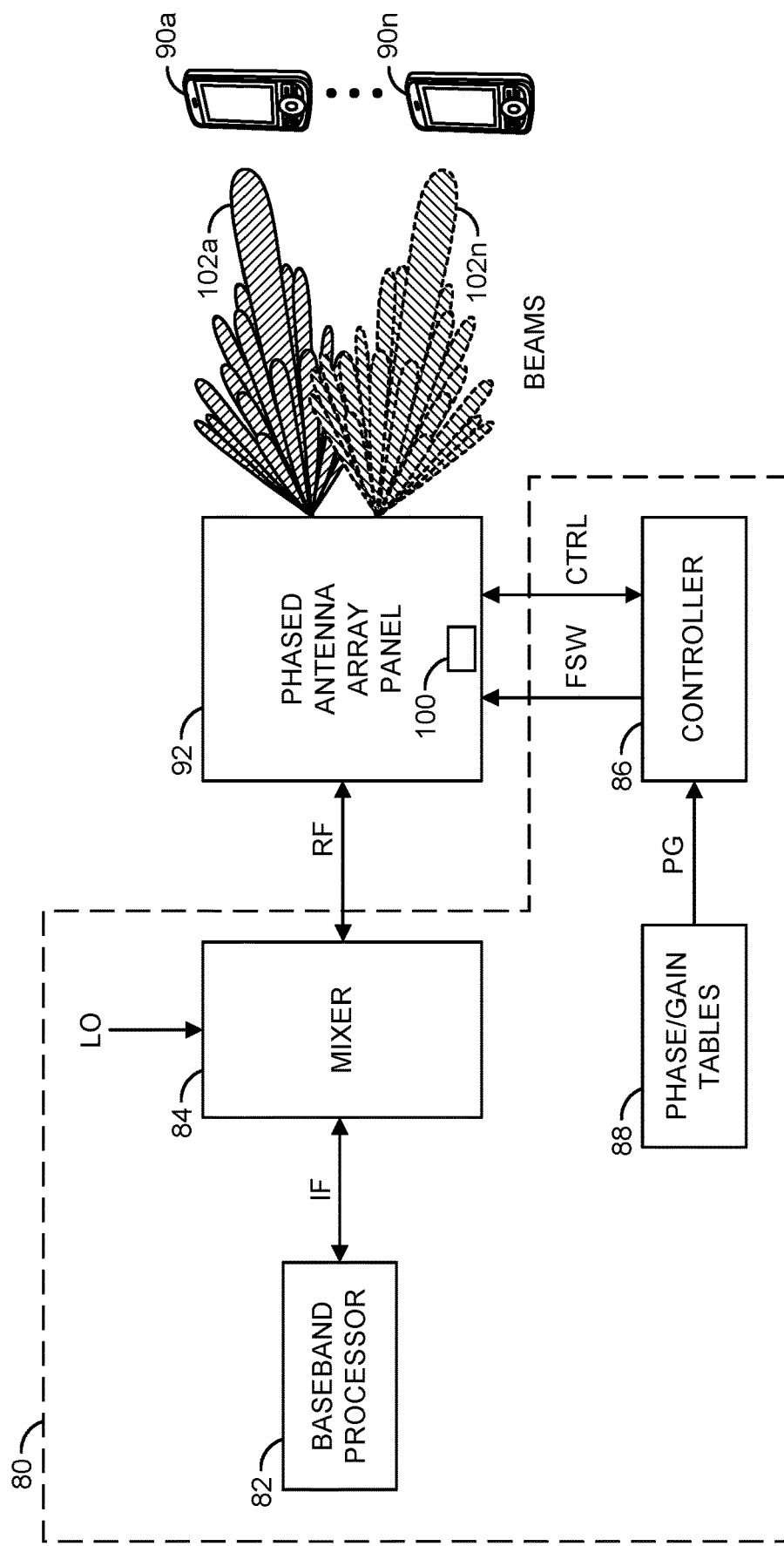
FIG. 1 is a diagram of a system illustrating an example context of the invention.

Referring to FIG. 1, a block diagram of a system 80 is shown illustrating an example context of the invention. The system (or module or circuit or apparatus) 80 may implement a radio-frequency (RF) transceiver system in accordance with an example embodiment of the invention. The RF transceiver system 80 may be configured to operate at common wireless radio frequencies, millimeter-wave frequencies, and/or microwave frequencies. In an example, the RF transceiver system 80 may be configured to facilitate communication with and/or between a plurality of communications devices (or terminals) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 92. The phased array antenna panel 92 may include a number of beam former circuits (or chips) 100 comprising integrated transmit-receive (TRX) channels with phase shifter circuits in accordance with an example embodiment of the invention.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radiocommunication Sector (ITU-R)), a satellite communication (SATCOM) system, and point-to-point communications systems such as common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. In various embodiments, the blocks 82-88 may be implemented with hardware, a combination of hardware and software, and/or simulated with software. A signal (e.g., IF) may be exchanged between the circuit 82 and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 92. The signal RF may be a radio-frequency, millimeter-wave frequency, or microwave frequency signal that conveys the information also found in the intermediate-frequency signal IF.

In a transmit mode, the radio-frequency signal RF may convey information to be broadcast from the phased array antenna panel 92 to the devices 90a-90n. In a receive mode, the radio-frequency signal RF may convey information received from the devices 90a-90n via the phased array antenna panel 92. A signal (e.g., FSW) and a signal or signals (e.g., CTRL) may be exchanged between the circuit 86 and the phased array antenna panel 92. The signal FSW may switch the phased array antenna panel 92 between the transmit mode and the receive mode. The signal(s) CTRL may convey data, clocking, and control elements. In an example, the signals FSW and CTRL may be part of a digital interface of the phased array antenna panel 92. In an example, the signal(s) CTRL may be implemented as a serial link that conveys information for configuring and/or determining phase and/or gain settings for antenna elements of the phased array antenna panel 92. In an example, the signal(s) CTRL may be compliant with one or more serial communication protocols or interfaces (e.g., serial peripheral interface (SPI), inter-integrated circuit communications (I2C), daisy chain, etc.). A signal or signals (e.g., PG) may be transferred from the circuit 88 to the circuit 86. In an example, the signal(s) PG may convey phase information and gain information used by the circuit 86 to implement (control) beam steering using the phased array antenna panel 92. In an example, the signal(s) PG may convey a plurality of phase and gain values that may be programmed into a plurality of beam former circuits 100 of the phased array antenna panel 92 via the signal(s) CTRL.

The phased array antenna panel 92 generally implements a hard-wired address scheme. The hard-wired address scheme may be used to uniquely identify serial communications intended for elements (e.g., the beam former circuits 100) of the phased array antenna panel 92. In various embodiments, multiple phased array antenna panels 92 may be combined to form a larger antenna array that may provide more transmission channels. The multiple phased array antenna panels 92 may share a serial communication channel, link, or bus. Each of the phased array antenna panels 92 making up the larger antenna array may be uniquely addressed using respective hard-wired addresses.

The phased array antenna panel 92 may generate one or more fields (or beams) 102a-102n. The fields 102a-102n may represent a field pattern (or radio-frequency beam pattern) created by the beam former circuits 100 of the phased array antenna panel 92 based upon the phase and gain information (values) received via the signal(s) CTRL. The phased array antenna panel 92 may be configured to produce directional beams 102a-102n for communication with the communication devices 90a-90n. In an example, the beam former circuits 100 of the phased array antenna panel 92 may be controlled to steer the beams 102a-102n, based on the phase and gain information received via the signal(s) CTRL, to track movement of the communication devices 90a-90n and/or switch between the communication devices 90a-90n.

The circuit 82 may implement a baseband processor circuit. The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90a-90n.

The circuit 84 may implement one or more mixer circuits. The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4 GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

The circuit 86 may implement a control circuit. In various embodiments, the circuit 86 may be implemented using one or more of an application specific integrated circuit (ASIC), controller, microprocessor, or circuitry configured accordingly. The circuit 86 is generally operational to control the operations of the phased array antenna panel 92. In some embodiments, the circuit 86 may determine the setting values used in each transceiver channel within the beam former circuits 100 of the phased array antenna panel 92. The setting values may establish the geometry of the field(s) or beam(s) 102a-102n. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the beam former circuits 100 of the phased array antenna panel 92 to establish the fields 102a-102b. The phase values and the gain values may be fetched from the circuit 88 via the signal PG and programmed into buffers associated with the beam former circuits 100 of the phased array antenna panel 92 by the circuit 86. In various embodiments, the circuits 86 and 88 may be implemented either on the same integrated circuit or on different (separate) integrated circuits.

In an example, the phased array antenna panel 92 may be implemented comprising either single-polarization (or single-pole) antenna elements or dual-polarization (or dual-pole or di-pole) antenna elements. The phased array antenna panel 92 may be operational to transmit and receive wireless signals to and from the devices (or terminals) 90a-90n. The devices (or terminals) 90a-90n may be remotely located from the RF transceiver system 80. Sensitivity to the wireless signals may be determined by the fields 102a-102n created by the phased array antenna panel 92. The phased array antenna panel 92 may comprise a plurality of antenna elements and a plurality of the beam former circuits 100. Each beam former circuit 100 may implement a plurality of transceiver channels. Each transceiver channel generally comprises a transmit channel (or chain) and a receive channel (or chain). The transceiver channels may be coupled to the antenna elements by corresponding bidirectional radio-frequency signals. The transceiver channels and antenna elements generally form a two-dimensional antenna network.

Figure 2:
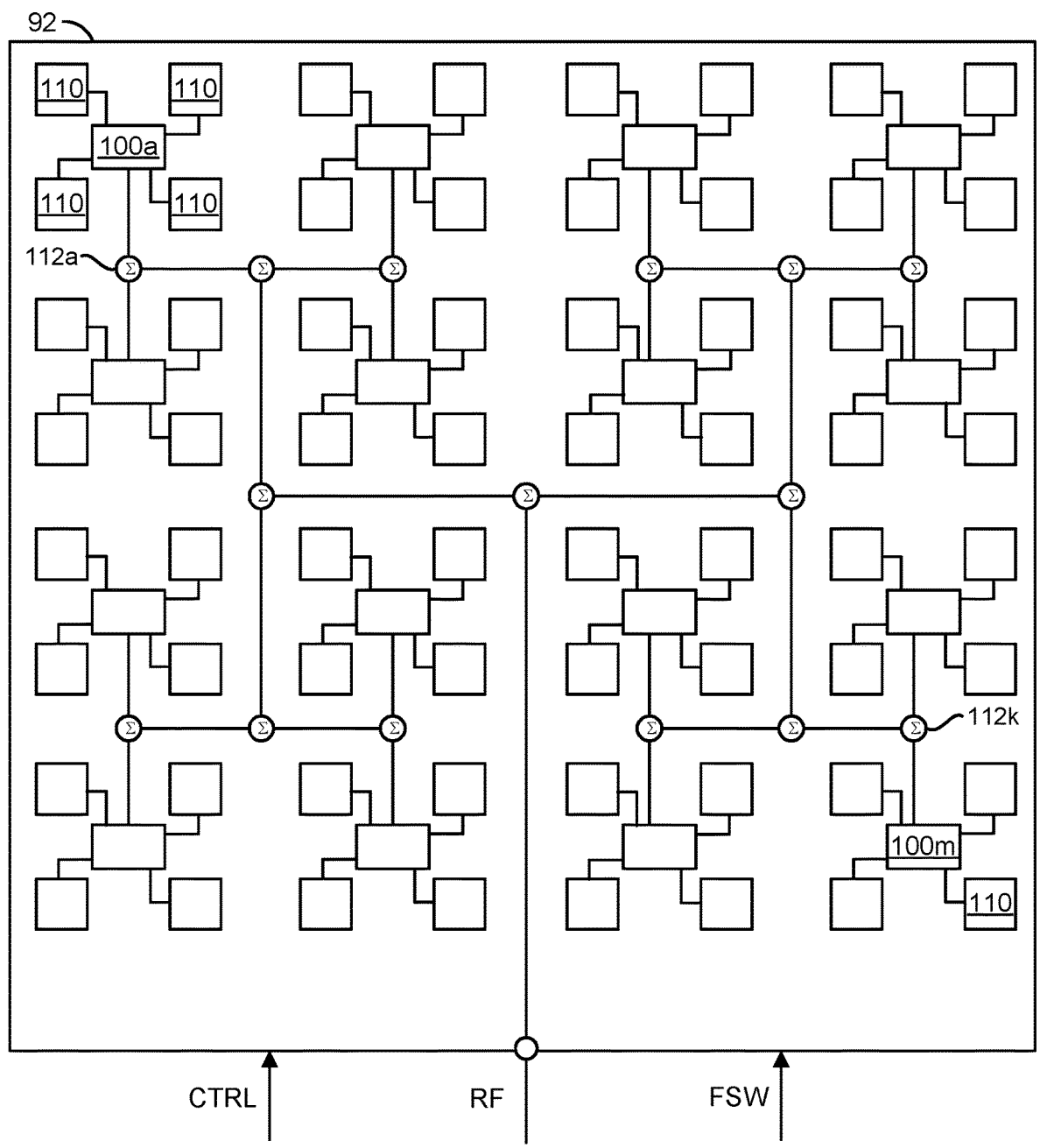
FIG. 2 is a diagram illustrating a single-polarization phased array antenna panel in accordance with an example embodiment of the invention.

Referring to FIG. 2, a diagram is shown illustrating an example implementation of a single-polarization version of the phased array antenna panel 92 in accordance with an embodiment of the invention. In an example, the phased array antenna panel 92 may comprise a number of beam former circuits 100a-100m, a number of antenna elements 110, and a number of blocks (or circuits) 112a-112k. In embodiments implementing a single-polarization phased array antenna panel, the antenna elements 110 generally are implemented as single polarization (or single-pole) antenna elements. Each of the circuits 100a-100m may implement a single-polarization beam former circuit. Each of the circuits 112a-112k may implement a combiner/splitter circuit. The circuits 100a-100m, and 112a-112k may be implemented with hardware, a combination of hardware and software, and/or simulated with software. In an example, the signal RF may be exchanged with one of the circuits 112a-112k. The signals FSW and CTRL may be exchanged with the circuits 100a-100m.

The antenna elements 110 in the phased array antenna panel 92 may be used for both transmission and reception. A physical positioning of the antenna elements 110 generally provides for two-dimensional (e.g., horizontal and vertical) control of the fields 102a-102n. In an example, the antenna elements 110 may be arranged in a 2-dimensional (e.g., N×N) grid pattern, where N is an integer value divisible by two. However, other dimensions of grid patterns may be implemented accordingly to meet design criteria of a particular implementation.

The circuits 100a-100m are generally operational to multiplex/demultiplex the signal RF with a number of the antenna elements 110. In various embodiments, each of the circuits 100a-100m may be mounted on a substrate of the phased array antenna panel 92 adjacent to (e.g., centered among) a number (or group) of the antenna elements 110. In an example, each circuit 100a-100m generally comprises a number of transceiver channels that are coupled to respective antenna elements 110. In an example, each circuit 100a-100m may be coupled to four adjacent antenna elements 110 (e.g., arranged in a 2×2 grid around each circuit 100a-100m). However, other numbers (e.g., 1, 2, 4, 18, etc.) of adjacent antenna elements 110 may be implemented to meet design criteria of a particular implementation.

The circuits 100a-100m may be configured to switch between a transmit mode and a receive mode in response to the signal FSW. In the transmit mode, the circuits 100a-100m may be operational to rapidly change setting values (e.g., phase values, gain values, etc.) used by the transceiver channels in order to steer the beams (or fields) 102a-102n and/or 104a-104n formed by the phased array antenna panel 92. In various embodiments, each of the circuits 100a-100m may comprise a memory, register store, and/or lookup table (LUT) that may be utilized to store a plurality of phase and gain values for each channel of the circuits 100a-100m corresponding to a plurality of beams in a predetermined beam space. In an example, the plurality of phase and gain values for each channel may be associated with an index corresponding to each beam of the beam space. In various embodiments, each of the circuits 100a-100m may be implemented as one or more integrated circuits (e.g., in a package or multi-chip module (MCM)).

In various embodiments, each of the circuits 112a-112k may be implemented as a combiner/splitter circuit. In an example, the circuits 112a-112k may be implemented as Wilkinson combiner/splitters. In various embodiments, the circuits 112a-112k may be coupled together to form a network that couples the circuits 100a-100m to an input/output of the phased array antenna panel 92 configured to present/receive the signal RF. In the transmit mode, the circuits 112a-112k are generally operational to distribute the power in the signal RF among the circuits 100a-100m. In the receive mode, the circuits 112a-112k may be operational to combine the power received in signals from the circuits 100a-100m into the signal RF. The circuits 100a-100n and 112a-112k are generally configured to provide a substantially equivalent path length between the RF input/output of the phased array antenna panel 92 and each of the circuits 100a-100m.

Figure 3:
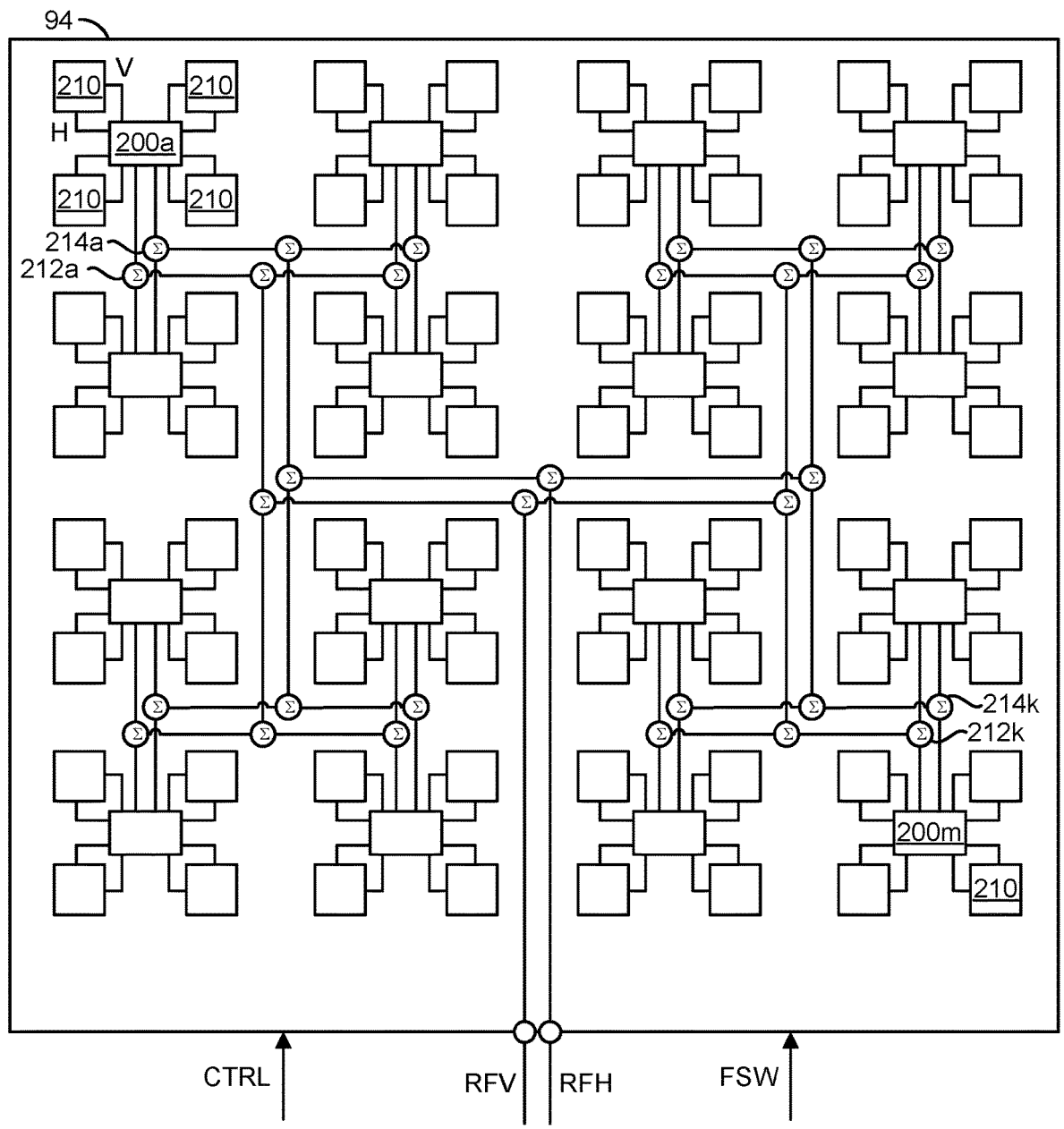
FIG. 3 is a diagram illustrating a dual-polarization phased array antenna panel in accordance with an example embodiment of the invention.

Referring to FIG. 3, a diagram is shown illustrating an example implementation of a dual-polarization phased array antenna panel 94 in accordance with another example embodiment of the invention. In embodiments implementing dual-polarization transceiver channels, the phased array antenna panel 94 may be used in place of the phased array antenna panel 92 of FIG. 1. In an example, the phased array antenna panel 94 may comprise a number of blocks (or circuits) 200a-200m, a number of blocks (or circuits) 210, a number of blocks (or circuits) 212a-212k, and a number of blocks (or circuits) 214a-214k. In embodiments implementing a dual-polarization phased array antenna panel, the blocks 210 generally are implemented as dual-polarization (or dual-pole or di-pole) antenna elements. Each of the circuits 200a-200m may implement a dual-polarization beam former circuit. Each of the circuits 212a-212k and 214a-214k may implement a combiner/splitter circuit. The circuits 200a-200m, 212a-212k, and 214a-214k may be implemented with hardware, a combination of hardware and software, and/or simulated with software. In embodiments implementing the dual-polarization phased array antenna panel 94, the signal RF may comprise a vertical polarized component (e.g., RFV) and a horizontal polarized component (e.g., RFH). In an example, the signal RFV may be exchanged with one of the circuits 212a-212k and the signal RFH may be exchanged with one of the circuits 214a-214k. The signals FSW and CTRL may be exchanged with the circuits 212a-212m.

The antenna elements 210 in the phased array antenna panel 94 may be used for both transmission and reception. A physical positioning of the antenna elements 210 generally provides for two-dimensional (e.g., horizontal and vertical) control of the fields 102a-102n and/or 104a-104n. In an example, the antenna elements 210 may be arranged in a 2-dimensional (e.g., N×N) grid pattern, where N is an integer value divisible by 2. However, other dimensions of grid patterns may be implemented accordingly to meet design criteria of a particular implementation.

The circuits 212a-212m are generally operational to multiplex/demultiplex the signals RFV and RFH with a number of the antenna elements 210. In various embodiments, each of the circuits 212a-212m may be mounted on a substrate of the phased array antenna panel 94 adjacent to a number of the antenna elements 210. Each of the circuits 212a-212m may have respective horizontal (H) and vertical (V) input/outputs that may be coupled to corresponding horizontal (H) and vertical (V) input/outputs (or feeds) of the adjacent antenna elements 210. In an example, each circuit 212a-212m generally comprises a number of transceiver channels that are coupled to respective horizontal and vertical input/outputs. In an example, each circuit 212a-212m may be coupled to four adjacent antenna elements 210 (e.g., arranged in a 2×2 grid around each circuit 212a-212m).

The circuits 212a-212m may be configured to switch between a transmit mode and a receive mode in response to the signal FSW. In the transmit mode, the circuits 212a-212m may be operational to rapidly change setting values (e.g., phase values, gain values, etc.) used by the transceiver channels in order to steer the fields 102a-102n and/or 104a-104n formed by the phased array antenna panel 94. In various embodiments, each of the circuits 212a-212m may comprise a memory, register store, and/or lookup table (LUT) that may be utilized to store a plurality of phase and gain values for each channel of the circuits 212a-212m corresponding to a plurality of beams in a predetermined beam space. In an example, the plurality of phase and gain values for each channel may be associated with an index corresponding to each beam of the beam space. In various embodiments, each of the circuits 212a-212m may be implemented as one or more integrated circuits (e.g., in a package or multi-chip module (MCM)). In an example, each of the circuits 212a-212m may be mounted on a substrate of the phased array antenna panel 94 adjacent to (e.g., centered among) the respective antenna elements 210.

In various embodiments, each of the circuits 212a-212k and 214a-214k may implement a combiner/splitter circuit. In an example, each of the circuits 212a-212k and 214a-214k may be implemented as a Wilkinson combiner/splitter circuit. The circuits 212a-212k may be coupled together to form a network that couples the circuit 212a-212m to an input/output of the phased array antenna panel 94 configured to present/receive the signal RFV. The circuits 214a-214k may be coupled together to form a network that couples the circuit 212a-212m to an input/output of the phased array antenna panel 94 configured to present/receive the signal RFH. In the transmit mode, the circuits 212a-212k and 214a-214k are generally operational to distribute the power in the signals RFV and RFH, respectively, among the circuits 212a-212m. In the receive mode, the circuits 212a-212k and 214a-214k may be operational to combine the power received in signals from the circuits 212a-212m, respectively, into the signals RFV and RFH. The circuits 212a-212n, 212a-212k, and 214a-214k are generally configured to provide a substantially equivalent path length between the RFV input/output and the RFH input/output of the phased array antenna panel 94 and each of the circuits 212a-212m.

Figure 4:
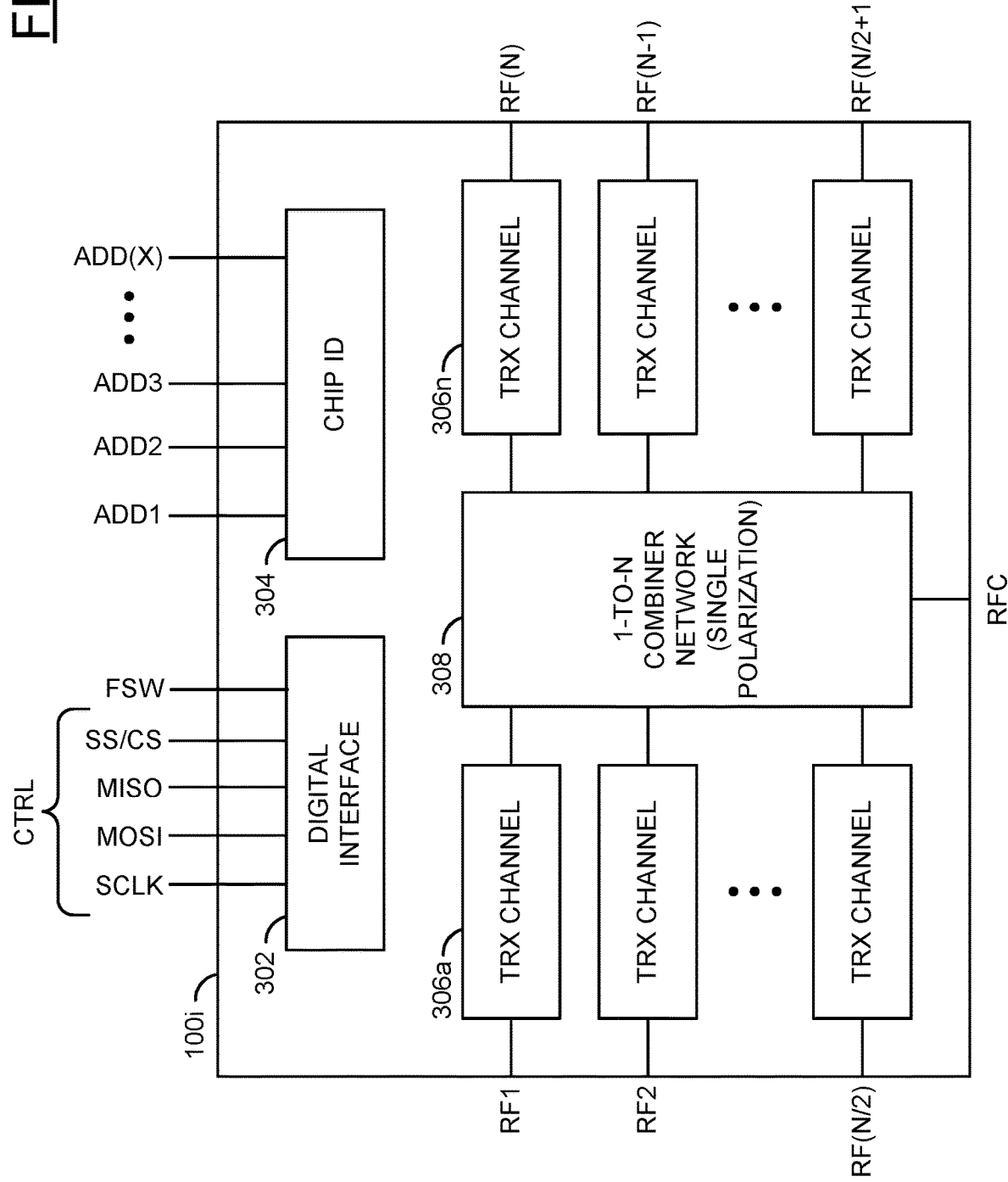
FIG. 4 is a diagram illustrating a single-polarization beam former circuit in accordance with an example embodiment of the invention.

Referring to FIG. 4, a diagram is shown illustrating an example implementation of a single-polarization beam former circuit 100i in accordance with an example embodiment of the invention. In an example, the single-polarization beam former circuit 100i may be representative of the single-polarization beam former circuits 100a-100m of FIG. 2. In an example, the single-polarization beam former circuit 100i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation.

In various embodiments, the signal RF may be presented/received by the common RF input/output RFC, and the antenna input/output ports RF1-RFN may be coupled to respective antenna elements 110. The single-polarization beam former circuit 100i generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting or receiving based upon the signal FSW.

The single-polarization beam former circuit 100i generally implements a transmit mode and a receive mode. In an example, a state of the signal FSW may determine whether the transmit mode or the receive mode is active. In the transmit mode, the single-polarization beam former circuit 100i is generally configured to receive the radio frequency signal RF at the common input/output port RFC and present radio frequency signals at the antenna input/output ports RF1-RFN. The signals presented at each of the antenna input/output ports RF1-RFN are generated by the single-polarization beam former circuit 100i in response to the radio frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 100i is generally configured to combine radio frequency signals received at the antenna input/output ports RF1-RFN for presentation as the signal RF at the common input/output port RFC.

The single-polarization beam former circuit 100i may comprise a block (or circuit) 302, a block (or circuit) 304, a number of blocks (or circuits) 306a-306n, and a block (or circuit) 308. The circuit 302 may implement an interface circuit. In various embodiments, the circuit 302 may implement a digital interface. The circuit 304 may implement a hard-wired address (e.g., chip ID) for the beam former circuit 100i. The circuits 306a-306n may implement transceiver (TRX) channels. The circuit 308 may implement a 1-to-N combiner/splitter network.

In an example, the signals FSW and CTRL are exchanged with the circuit 302. In an example, the circuit 302 may comprise a serial interface. The circuit 302 may be configured to be compliant with one or more serial interface standards including, but not limited to, serial peripheral interface (SPI), inter-integrated circuit (I2C), daisy chain, etc. In an example, the circuit 302 may be configured to allow programming and control of the single-polarization beam former circuit 100i using a serial communication link (or bus). In an example, the circuit 302 may be configured to program and control the circuits 306a-306n in response to the signals CTRL and FSW. In an example, the circuit 302 may control whether the circuits 306a-306n operate in a transmit mode or a receive mode in response to the signal FSW.

In an example, the circuit 302 may implement a 4-wire embedded SPI core. In an example, the circuit 302 may have a first pin that may receive a first signal (e.g., MOSI), a second pin that may present a second signal (e.g., MISO), a clock input pin that may receive a clock signal (e.g., SCLK), and a chip enable (or chip select) pin that may receive a signal (e.g., SS/CS). In an example, the signals MOSI, MISO, SCLK, and SS/CS may be components of the signal(s) CTRL. In an example, the circuit 302 may include a transmit/receive function switching pin that may receive the signal FSW. In an example, the signals MOSI, MISO, SCLK, and SS/CS may be configured to implement a 4-wire SPI protocol interface as summarized in the following TABLE 1:

TABLE 1

| SIGNAL | FUNCTION |
| --- | --- |
| MOSI | Master out Slave in |
| MISO | Master in Slave out |
| SCLK | Serial clock |
| SS/CS | Slave Select/Chip Select |

In an example, the circuit 304 may set a physical address of the beam former circuit 100i based upon hardware coded address bits (or pins). In various embodiments, a hard-wired address may be implemented having a number (e.g., X) of input bits (e.g., ADD1, ADD2, . . . , ADD (X)). In an example, the address may be implemented having six bits (or pins). In some embodiments, the hard-wired address may be set to predetermined logic levels (e.g., 0 or 1) by tying a number of address pins to predetermined supply voltages (e.g., GND, VSS, or VDD). In some embodiments, the hard-wired address bits may be hard coded within the chip implementing the beam former 100i. In some embodiments, the hard-wired address bits may be programmable within the chip implementing the beam former 100i during manufacturing. In an example, the hard-wired address bits may be programmed using fuses, anti-fuses, or other conventional techniques.

Figure 5:
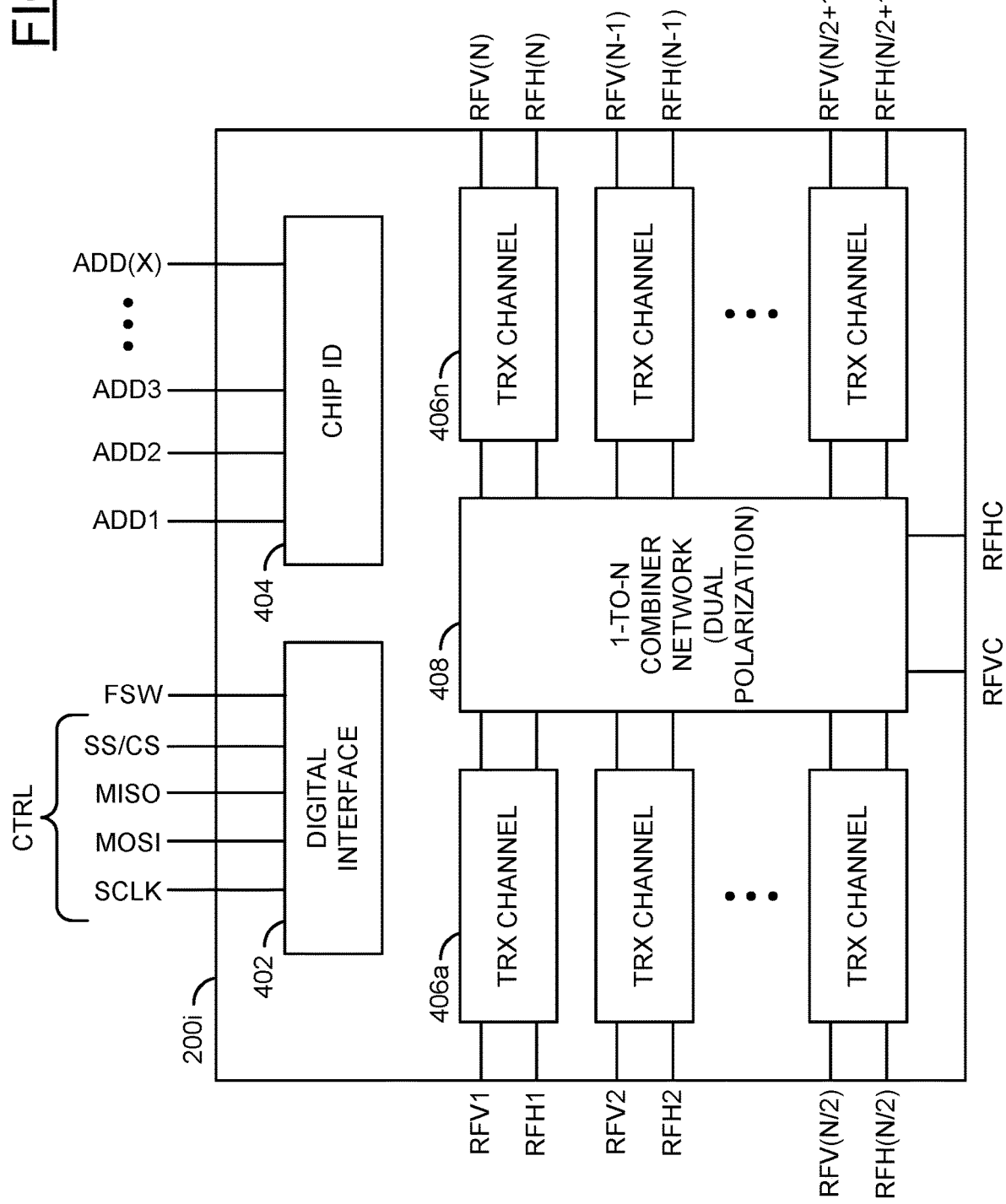
FIG. 5 is a diagram illustrating a dual-polarization beam former circuit in accordance with an example embodiment of the invention.

Referring to FIG. 5, a diagram is shown illustrating an example implementation of a dual-polarization beam former circuit 200i in accordance with an example embodiment of the invention. In an example, the dual-polarization beam former circuit 200i may be representative of the dual-polarization beam former circuits 200a-200m of FIG. 3. In an example, the dual-polarization beam former circuit 200i may have a digital interface configured to receive the signal FSW and the signal(s) CTRL, a first common RF input/output port (RFVC), a second common RF input/output port (RFHC), a number of vertical antenna input/output ports (RFV1-RFV(N)), and a number of horizontal antenna input/output port (RFH1-RFH(N)). In general, any number (e.g., N) of vertical and horizontal antenna input/output ports (or channels) may be implemented accordingly to meet design criteria of a particular implementation.

In various embodiments, the signal RFV may be presented/received by the common RF input/output RFVC, the signal RFH may be presented/received by the common RF input/output RFHC, the vertical antenna input/output ports RFV1-RFV(N) may be coupled to corresponding vertical input/outputs of the respective antenna elements 210, and the horizontal antenna input/output ports RFH1-RFH(N) may be coupled to corresponding horizontal input/outputs of the respective antenna elements 210. The dual-polarization beam former circuit 200i generally implements a number (e.g., N) of transceiver channels corresponding to the number of pairs of vertical and horizontal antenna input/output ports (RFV1, RFH1), (RFV2, RFH2), (RFV(N), RFH(N)). In various embodiments, each of the transceiver channels may comprise a respective transmit channel and a respective receive channel. The transceiver channels are generally configured to switch between transmitting or receiving based upon the signal FSW.

The dual-polarization beam former circuit 200i generally implements a transmit mode and a receive mode. In an example, a state of the signal FSW may determine whether the transmit mode or the receive mode is active. In the transmit mode, the dual-polarization beam former circuit 200i is generally configured to receive radio frequency signals at the common input/output ports RFVC and RFHC, and present radio frequency signals at the antenna input/output ports RFV1-RFV(N) and RFH1-RFH(N). The signals presented at each of the antenna input/output ports RFV1-RFV(N) and RFH1-RFH(N) are generated by the dual-polarization beam former circuit 200i in response to the radio frequency signals received at the common input/output ports RFVC and RFHC and a respective number of setting values (e.g., gain, phase, etc.) corresponding to each of the antenna input/output ports RFV1-RFV(N) and RFH1-RFH (N).

In an example, the dual-polarization beam former circuit 200*i* may comprise a block (or circuit) 402, a block (or circuit) 404, a number of blocks (circuits) 406*a*-406*n*, and a block (or circuit) 408. The circuit 402 may implement an interface circuit. In various embodiments, the circuit 402 may implement a digital interface. The circuit 404 may implement a hard-wired address (e.g., chip ID) for the beam former circuit 200*i*. The circuits 406*a*-406*n* may implement transceiver (TRX) channels. The circuit 408 may implement a 1-N dual-channel combiner/splitter network.

In an example, the signals FSW and CTRL are exchanged with the circuit 402. In an example, the circuit 402 may comprise a serial interface. The circuit 402 may be configured to be compliant with one or more serial interface standards including, but not limited to, serial peripheral interface (SPI), inter-integrated circuit (I2C), daisy chain, etc. In an example, the circuit 402 may be configured to allow programming and control of the dual-polarization beam former circuit 200*i* using a serial communication link (or bus). In an example, the circuit 402 may be configured to program and control the circuits 406*a*-406*n* in response to the signals CTRL and FSW. In an example, the circuit 402 may control whether the circuits 406*a*-406*n* operate in a transmit mode or a receive mode in response to the signal FSW.

In an example, the circuit 402 may implement a 4-wire embedded SPI core. In an example, the circuit 402 may have a first pin that may receive a first signal (e.g., MOSI), a second pin that may present a second signal (e.g., MISO), a clock input pin that may receive a clock signal (e.g., SCLK), and a chip enable (or chip select) pin that may receive a signal (e.g., SS/CS). In an example, the signals MOSI, MISO, SCLK, and SS/CS may be components of the signal(s) CTRL. In an example, the circuit 402 may include a transmit/receive function switching pin that may receive the signal FSW. In an example, the signals MOSI, MISO, SCLK, and SS/CS may be configured to implement the 4-wire SPI protocol interface as summarized in the TABLE 1 above.

In an example, the circuit 404 may set a physical address of the dual-polarization beam former circuit 200*i* based upon hardware coded address bits (or pins). In various embodiments, a hard-wired address may be implemented having a number (e.g., X) of input bits (e.g., ADD1, ADD2, ADD (X)). In an example, the address may be implemented having six bits (or pins). In some embodiments, the hard-wired address may be set to predetermined logic levels (e.g., 0 or 1) by tying a number of address pins to predetermined supply voltages (e.g., GND, VSS, or VDD). In some embodiments, the hard-wired address bits may be hard coded within the chip implementing the beam former 200*i* during manufacturing. In some embodiments, the hard-wired address bits may be programmed within the chip implementing the beam former 200*i*. In an example, the hard-wired bits may be programmed using fuses, anti-fuses, or other conventional techniques.

Figure 6:
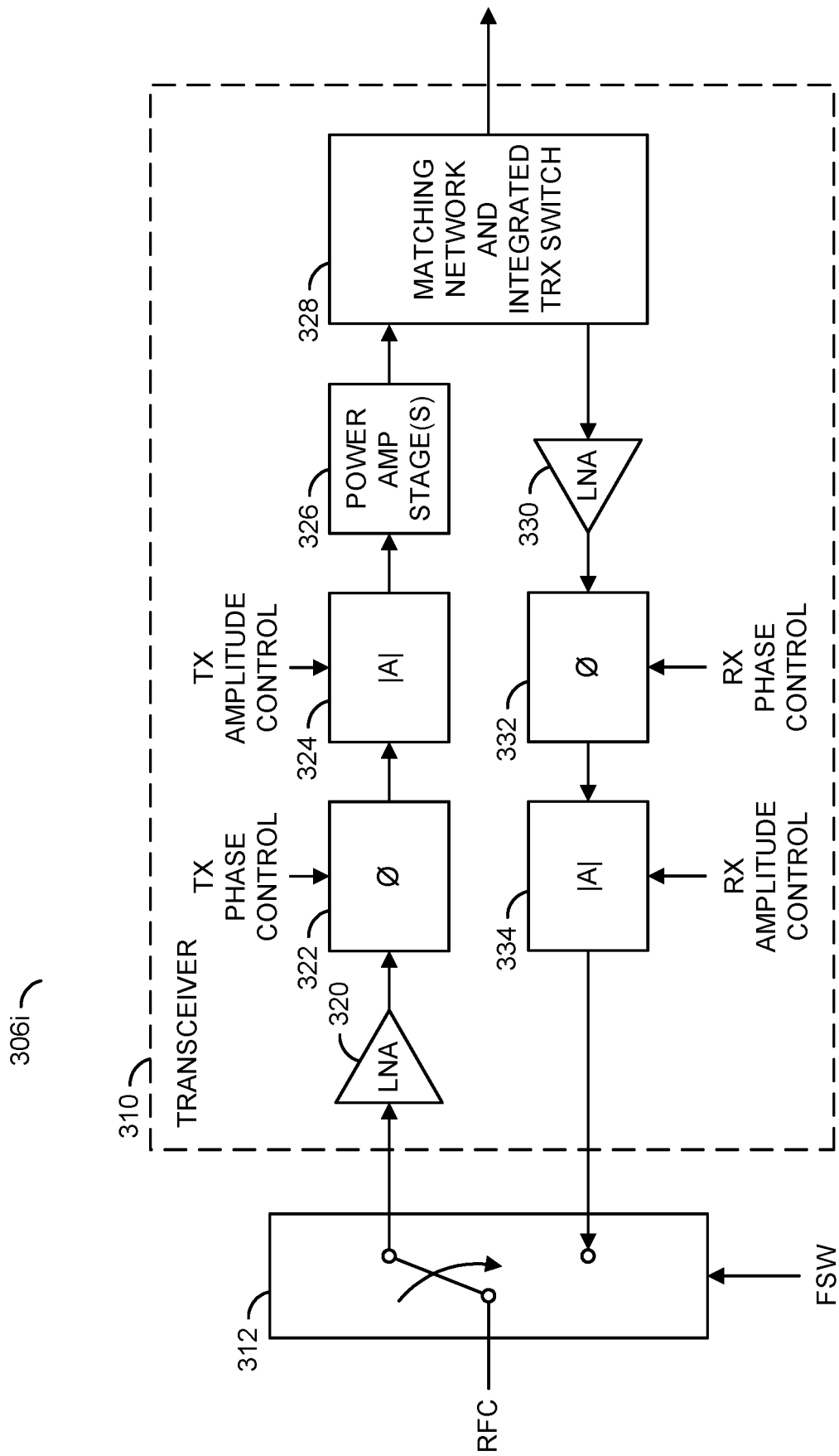
FIG. 6 is a diagram of a transceiver circuit illustrating an application of a phase shifter circuit in accordance with an example embodiment of the invention.

Referring to FIG. 6, a block diagram of a transceiver circuit 306*i* is shown illustrating a example radio frequency (RF) amplifier application in accordance with an embodiment of the invention. In an example, the transceiver circuit 306*i* may be representative of the single-polarization beam former transceiver circuits (or channels) 306*a*-306*d* of FIG. 4. In another example, the transceiver circuit 306*i* may be representative of either horizontal or vertical beam former transceiver circuits (or channels) of a dual-polarization beam former circuit (or chip). In an example embodiment, the circuit 306*i* may comprise a block (or circuit) 310 and a block (or circuit) 312. In an example embodiment, the circuit 310 may implement a transceiver circuit. The block 312 may implement transmit-receive (T/R) switch. A transceiver circuit is generally capable of both transmitting and receiving signals of a communication channel. In various embodiments, the circuit 310 may be capable of transmitting and receiving radio frequency (RF), microwave, and/or millimeter-wave signals.

In various embodiments, the circuit 310 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 310 may be representative of a radar application including, but not limited to target detection, ranging, and/or through-wall imaging. In an example, the transceiver circuit 310 generally comprises both a transmitter chain and a receiver chain. Both the transmitter chain and the receiver chain may comprise radio frequency (RF) amplifiers.

In an example, the transmitter chain may include an input amplifier 320, a variable (programmable) phase shifter 322, a variable (programmable) attenuator 324, and one or more output amplifier stages 326. An output of the transmitter chain may be coupled to an input of a block (or circuit) 328. In an example, the circuit 328 may implement a matching network and integrated transmit-receive (TRX) switch. In another example, the circuit 328 may comprise separate circuits implementing the matching network and TRX switch. In an example, the input amplifier 320 may be implemented as a low noise amplifier (LNA). The output amplifier stages 326 may include drivers, pre-amplifiers, and/or power amplifiers. In an example, the receiver chain may include a low noise amplifier (LNA) 330, a variable (programmable) phase shifter 332, and a variable (programmable) attenuator 334. An output of the circuit 328 may be coupled to an input of the low noise amplifier (LNA) 330. In various embodiments, the variable phase shifter 322 and the variable phase shifter 332 may be implemented using techniques described herein. In various embodiments, the input amplifier 320, the variable attenuator 324, the output amplifier stages 326, the LNA 330, and the variable attenuator 334 may be implemented using conventional techniques.

In an example, an input of the transmitter chain and an output of the receiver chain may be coupled to a transmission line or an RF transceiver system by the RF switch 312. In an example, an output of the transmitter chain and an input of the receiver chain may be coupled to a transmission line or an antenna (ANT) by an input/output of the circuit 328. In an example, the circuit 328 may implement an output matching network for the transmitter chain, an input matching network for the receiver chain, and an integrated TRX switch. In some embodiments, the integrated TRX switch of the circuit 328 may have a topology that may be absorbed into impedance matching elements of the power amplifier stage 326 and the low noise amplifier 330.

In various embodiments, the variable phase shifter 322 and the variable phase shifter 332 may be implemented using a phase shifter circuit configured to make a phase change by switching at least one of a capacitance value and an inductance value in response to respective control signals (e.g., TX PHASE CONTROL and RX PHASE CONTROL). In general, a characteristic impedance and the phase of each of the variable phase shifter 322 and the variable phase shifter 332 are correlated such that after the phase change, a value of the respective characteristic impedances is maintained at a predefined value. In various embodiments, the variable phase shifter 322 and the variable phase shifter 332 may be implemented using a bidirectional, linear, and passive circuit topology, which may be implemented in a compact footprint suitable for, but not limited to integrated circuit technologies. A phase shifter circuit in accordance with an embodiment of the invention may be applied in systems including, but not limited to, complex transceiver phased arrays and measurements systems.

In various embodiments, a systematic method is provided to derive values of circuit elements to perform accurate phase shift without affecting input and output port impedances and effecting amplitude variations on a transmitted signal. In various embodiments, the phase shifter circuit is generally scalable to any amount of phase shift, group delay shift, impedance level, center frequency and bandwidth. The technique is scalable for any number of phase states and any arbitrary phase resolution. In various embodiments, the phase shifter circuits may be implemented in single-ended and/or differential configurations. In an example, the phase shifter circuit topology may absorb parasitic capacitances of other active circuit elements, especially switches, to avoid unwanted frequency, bandwidth and other performance limitations. The phase shifter circuit topology may be particularly suited for, but not limited to, silicon, CMOS, FET, or HEMT technologies. In various embodiments, a phase shifter circuit may be implemented utilizing either an inductor with switched capacitors or a capacitor with switched inductors to provide the desired phase shift. In various embodiments, the methodology for derivation of values for inductor(s) and capacitor(s) generally assures constant input and output impedances and transmission loss of the network over different phase states.

An inductive-capacitive (LC) network generally exhibits a behavior similar to a transmission line over a narrow frequency range. Characteristic impedance and electrical length of the transmission line are generally determined by values of inductance (L) and capacitance (C). In conventional phase shifter circuit implementations, when the phase is changed by switching the capacitor or inductor values, the characteristic impedance changes as well, causing variation in input and output impedances. In various embodiments, the characteristic impedance and phase are correlated in such a way that after an arbitrarily selected phase change, the characteristic impedance returns to an original value and, therefore, no change in port impedance and/or insertion loss is observed. The parasitic capacitance of switches in an OFF state and the finite resistance of the switches in the ON state may be included in the design equations. Taking the parasitic capacitance and on-resistance of the switches in the phase shifter circuit into account generally enables implementation of the phase shifter circuits in accordance with embodiments of the invention even when the switches have excess capacitance and on-resistance.

Figure 7:
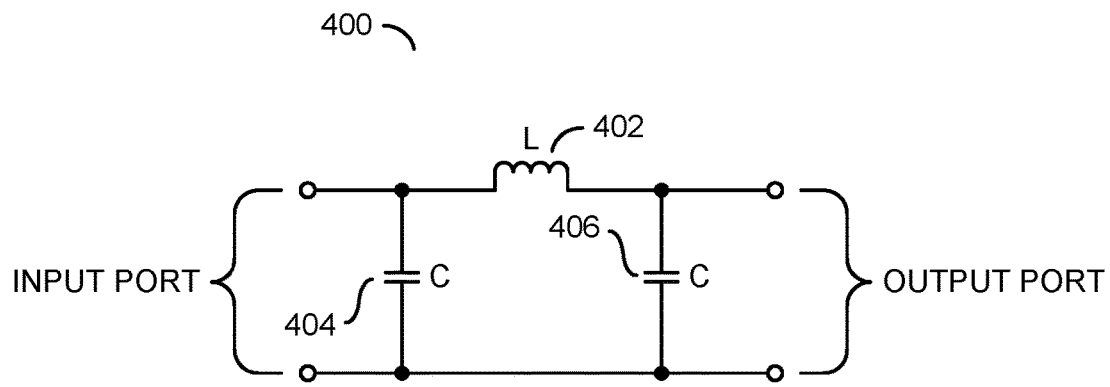
FIG. 7 is a diagram illustrating an example process of implementing a phase shifter circuit in accordance with an example embodiment of the invention.

Referring to FIG. 7, a diagram of a circuit 400 is shown illustrating an example process for implementing a phase shifting element in accordance with embodiments of the invention. In an example, the circuit 400 may implement a phase shifting element. The phase shifting element 400 may be constructed comprising an inductor 402, a first capacitor 404, and a second capacitor 406. The inductor 402 may have an inductance value (L). The capacitors 404 and 406 may have similar capacitance values (C). An input port of the phase shifting element 400 may be connected in parallel to the first capacitor 404, an output port of the phase shifting element 400 may be connected in parallel to the second capacitor 406, and the inductor 402 may be connected in series between the first capacitor 404 and the second capacitor 406. In an example, a first terminal of the input port may be connected to a first terminal of the first capacitor 404 and a first terminal of the inductor 402. A second terminal of the inductor 402 may be connected to a first terminal of the second capacitor 406 and a first terminal of the output port. A second terminal of the input port, a second terminal of the output port, a second terminal of the first capacitor 404, and a second terminal of the second capacitor 406 may be connected together.

In an example, the characteristic impedance ($Z_0$) and relative phase ($\theta$) of the input and output ports may be summarized in the following Equations 1 and 2:

$$\theta = \cos^{-1}(1 - LC\omega^2);  \quad \text{EQ. 1}$$

$$Z_0 = \sqrt{\frac{L}{C}} \times \sqrt{\frac{1}{1+\cos\theta}}. \quad \text{EQ. 2}$$

In various embodiments, the value C may be changed from a first value (e.g., $C_A$) to a second value (e.g., $C_B$) to achieve a desired phase change (e.g., $\Delta\theta$), without affecting the characteristic impedance $Z_0$. In an example, a design process may begin by selecting a first phase value (e.g., $\theta 1$) and calculating the product $LC_A$ using Equation 1. Choosing a desired first impedance value (e.g. $Z_{01}$) to be equal to the characteristic impedance (e.g. $Z_{01}=Z_0$), the ratio of $L/C_A$ may be found using Equation 2, and then the values L and $C_A$ determined. The design process may continue by determining a second phase value (e.g., $\theta 2$) by adding the desired phase change to the first phase value (e.g., $\theta 2=\theta 1+\Delta\theta$), and calculating the value $C_B$ using Equation 1. However, since the value L is not changed, a second impedance value (e.g., $Z_{02}$) is now fixed and not necessarily equal to the first impedance value $Z_{01}$. Because the only arbitrary selection is the first phase value $\theta 1$, the process generally continues by determining the first phase value $\theta 1$ that ensures that $Z_{02}=Z_{01}$. In an example, the determination of the first phase value $\theta 1$ may be done analytically or simply by iteration as illustrated below in connection with FIG. 8.

Figure 8:
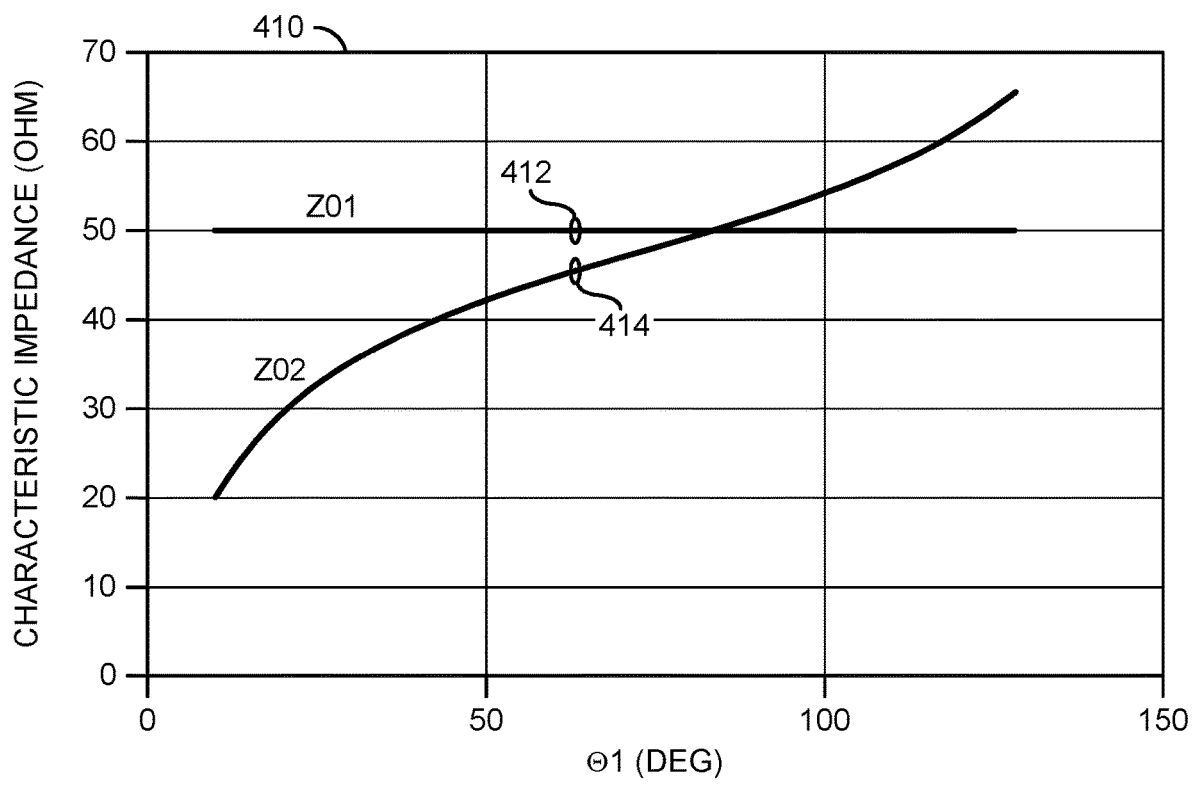
FIG. 8 is a diagram illustrating a process of determining an initial phase value in accordance with another example embodiment of the invention.

Referring to FIG. 8, a diagram of a graph 410 is shown illustrating a process for determining an initial phase value in accordance with an example embodiment of the invention. A first curve 412 illustrates the first impedance value $Z_{01}$ over a range of magnitudes of the first phase value $\theta 1$. A second curve 414 illustrates the second impedance value $Z_{02}$ over the range of magnitudes of the first phase value $\theta 1$. In an example with a desired phase change of fifteen degrees (e.g., $\Delta\theta=15$ degrees at 14 GHz) and $Z_n=Z_{01}=50$ ohms, the values for L, $C_A$, and $C_B$ may be determined as 563.5 pH, 199.4 fF, and 259.3 fF, respectively.

Figure 9:
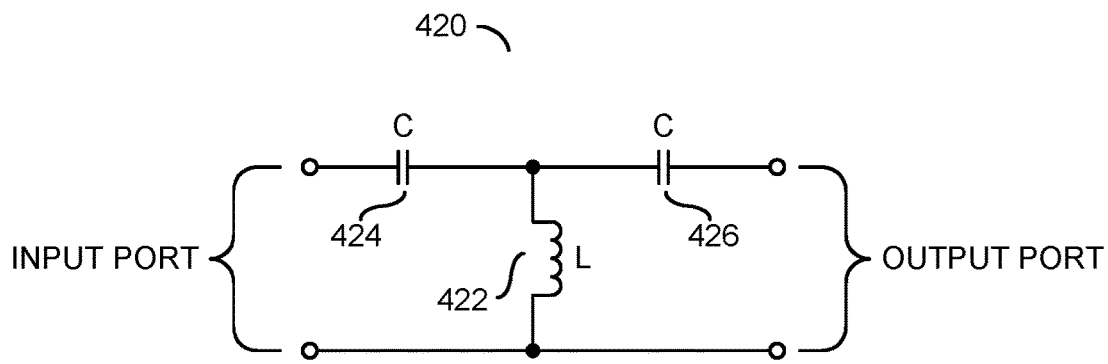
FIG. 9 is a diagram illustrating another example process of implementing a phase shifter circuit in accordance with an example embodiment of the invention.

Referring to FIG. 9, a diagram of a circuit 420 is shown illustrating an example process for implementing another phase shifting element in accordance with embodiments of the invention. In an example, the circuit 420 may implement a second phase shifting element. The phase shifting element 420 may be constructed comprising an inductor 422, a first capacitor 424, and a second capacitor 426. The inductor 422 may have an inductance value (L). The capacitors 424 and 426 may have similar capacitance values (C). The capacitors 424 and 426 may be connected in series between an input port and an output port of the phase shifting element 420.

The inductor 422 may be connected between the capacitors 424 and 426 with a shunt orientation. In an example, a first terminal of the input port may be connected to a first terminal of the first capacitor 424. A second terminal of the first capacitor 424 may be connected to a first terminal of the inductor 422 and a first terminal of the second capacitor 426. A second terminal of the second capacitor 426 may be connected to a first terminal of the output port. A second terminal of the input port, a second terminal of the output port, and a second terminal of the inductor 422 may be connected together.

In an example, the characteristic impedance ($Z_0$) and relative phase ($\theta$) of the input and output ports may be summarized in the following Equations 3 and 4:

$$\theta = \cos^{-1}\left(1 - \frac{1}{LC\omega^2}\right); \quad \text{EQ. 3}$$

$$Z_0 = \sqrt{\frac{L}{C}} \times \sqrt{1 + \cos\theta}. \quad \text{EQ. 4}$$

In various embodiments, the capacitance value C may be changed from a first value (e.g., $C_A$) to a second value (e.g., $C_B$) to achieve a desired phase change (e.g., $\Delta\theta$), without affecting the characteristic impedance $Z_0$. In an example, a design process may begin by selecting a first phase value (e.g., $\theta 1$) and calculating the product $LC_A$ using Equation 3. Choosing a desired first impedance value (e.g. $Z_{01}$) to be equal to the characteristic impedance (e.g. $Z_{01}=Z_0$), the ratio of $L/C_A$ may be found using Equation 4, and then the values L and $C_A$ determined. The design process may continue by determining a second phase value (e.g., $\theta 2$) by adding the desired phase change to the first phase value (e.g., $\theta 2=\theta 1+\Delta\theta$), and calculating the value $C_B$ using Equation 3. However, since the value L is not changed, a second impedance value (e.g., $Z_{02}$) is now fixed and not necessarily equal to the first impedance value $Z_{01}$. Because the only arbitrary selection was the first phase value $\theta 1$, the process generally continues by determining the first phase value $\theta 1$ that ensures that $Z_{02}=Z_{01}$. In an example, the determination of the first phase value $\theta 1$ may be done analytically or simply by iteration as illustrated below in connection with FIG. 10.

Figure 10:
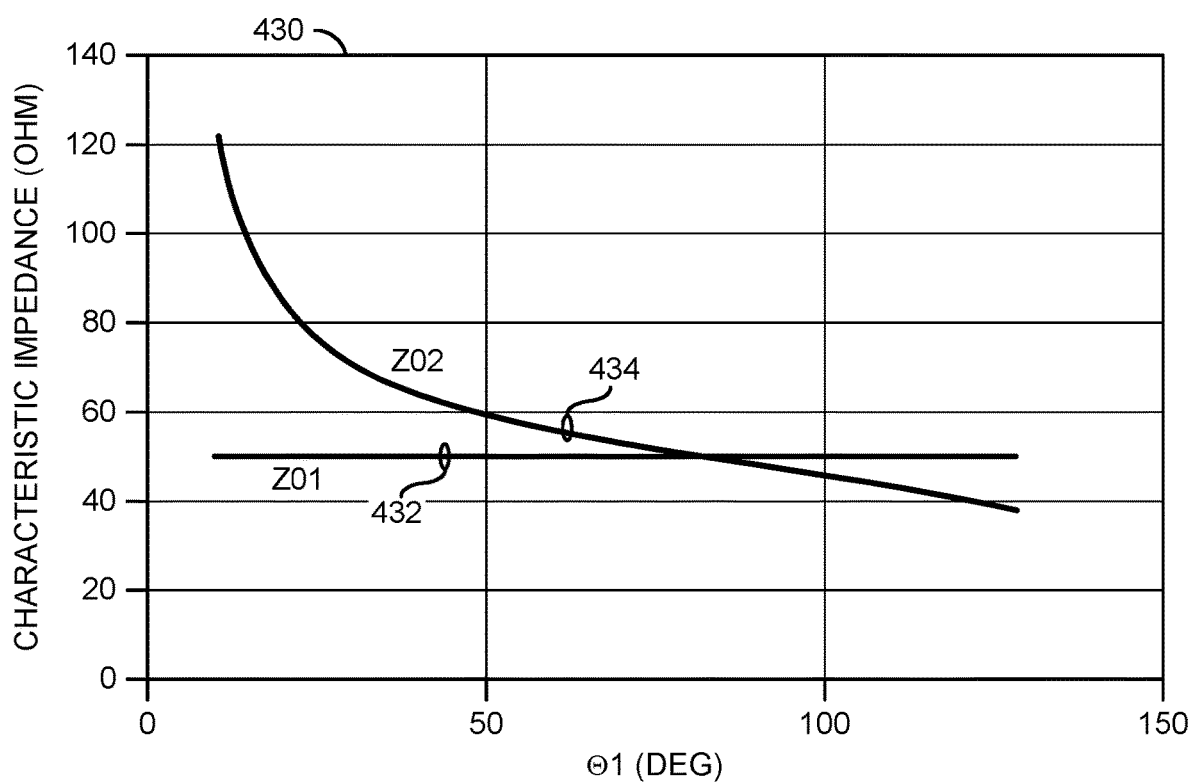
FIG. 10 is a diagram illustrating a process of determining an initial phase value in accordance with another example embodiment of the invention.

Referring to FIG. 10, a diagram of a graph 430 is shown illustrating a process for determining an initial phase value in accordance with another example embodiment of the invention. A first curve 432 illustrates the first impedance value $Z_{01}$ over a range of magnitudes of the first phase value $\theta 1$. A second curve 434 illustrates the second impedance value $Z_{02}$ over the range of magnitudes of the first phase value $\theta 1$. In an example with a desired phase change of fifteen degrees (e.g., $\Delta\theta=15$ degrees at 14 GHz) and $Z_{02}=Z_{01}=50$ ohms, the values for L, $C_A$, and $C_B$ may be determined as 573.3 pH, 259.2 fF, and 199.4 fF, respectively.

Figure 11:
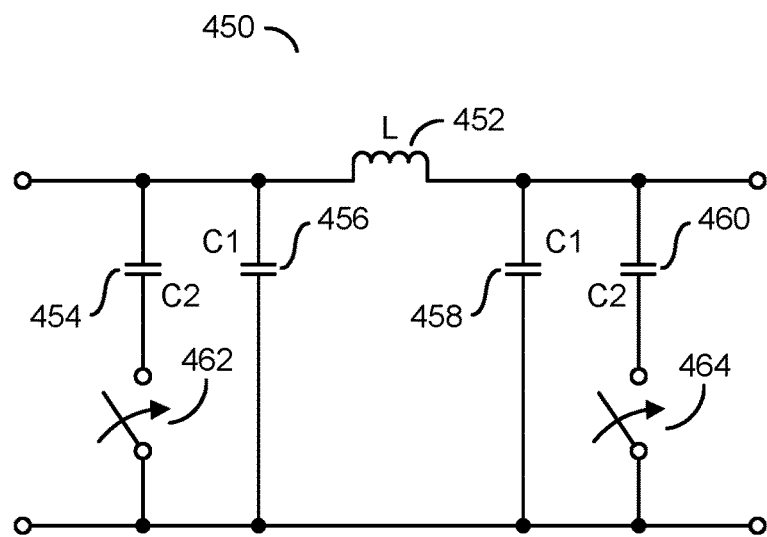
FIGS. 11-14 are diagrams illustrating bandwidth considerations with regard to the implementations of FIGS. 7 and 9.
Figure 12:
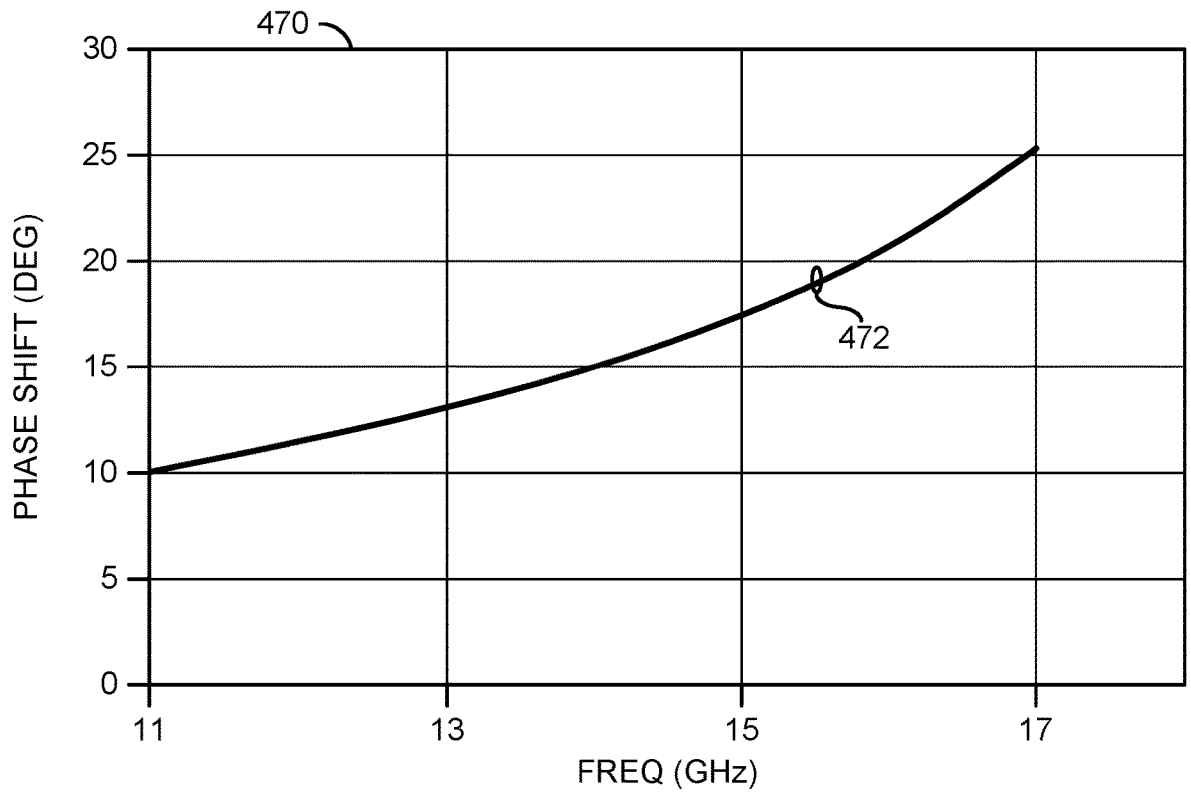

Referring to FIGS. 11-14, diagrams are shown illustrating phase shift behavior of the phase shifter circuit 400 of FIG. 7 and the phase shifter circuit 420 of FIG. 9. Referring to FIG. 11, a schematic diagram of a circuit 450 is shown illustrating a phase shifter circuit implementing the phase shifting element 400 of FIG. 7. In an example, the circuit 450 comprises an inductor 452, four capacitors 454, 456, 458, and 460, and two switches 462, 464. The inductor 452 may have an inductance value (L). The capacitors 456 and 458 may have similar capacitance values (C1). The capacitors 454 and 460 may have similar capacitance values (C2). An input port of the phase shifting element 450 may be connected in parallel to the capacitor 454 and the capacitor 456. An output port of the phase shifting element 450 may be connected in parallel to the capacitor 458 and the capacitor 460. The inductor 452 may be connected in series between the capacitor 454, the capacitor 456, the capacitor 458, and the capacitor 460. In an example, a first terminal of the input port may be connected to a first terminal of the capacitor 454, a first terminal of the capacitor 456, and a first terminal of the inductor 452. A second terminal of the inductor 452 may be connected to a first terminal of the capacitor 456, a first terminal of the capacitor 460, and a first terminal of the output port. A second terminal of the capacitor 454 may be connected to a first terminal of the switch 462. A second terminal of the capacitor 460 may be connected to a first terminal of the switch 464. A second terminal of the input port, a second terminal of the output port, a second terminal of the switch 462, a second terminal of the capacitor 456, a second terminal of the capacitor 458, and a second terminal of the switch 464 may be connected together. The switches 462 and 464 are generally configured to implement the switch between capacitance values C1 (switches 462 and 464 open) and C1+C2 (switches 462 and 464 closed). Referring to FIG. 12, a diagram of a graph 470 is shown illustrating the phase shift behavior of the phase shift element 400 of FIG. 7.

Figure 13:
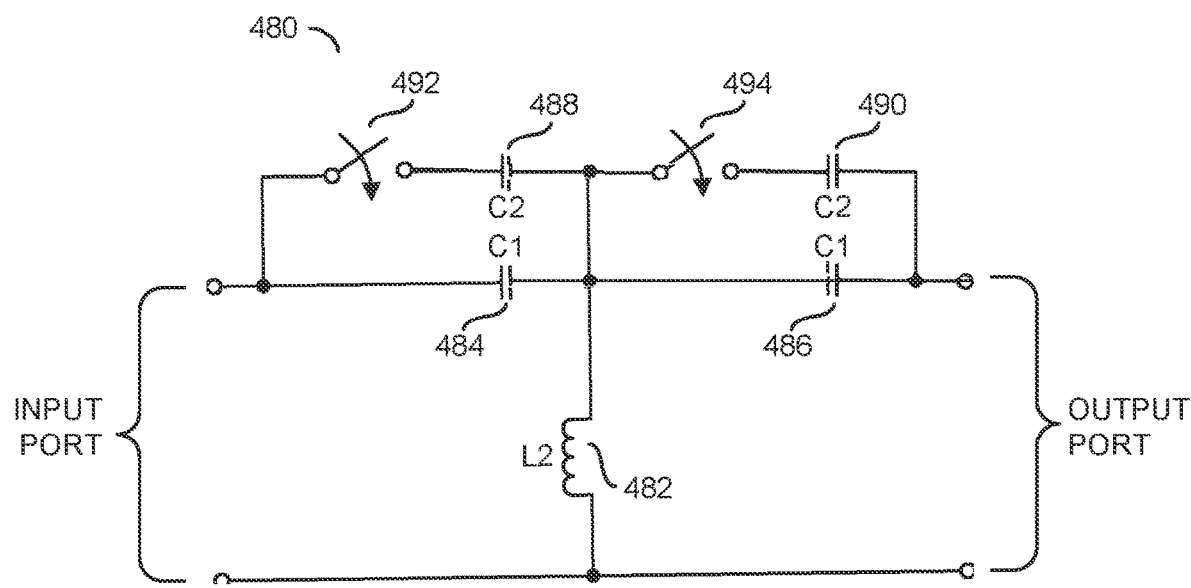
Figure 14:
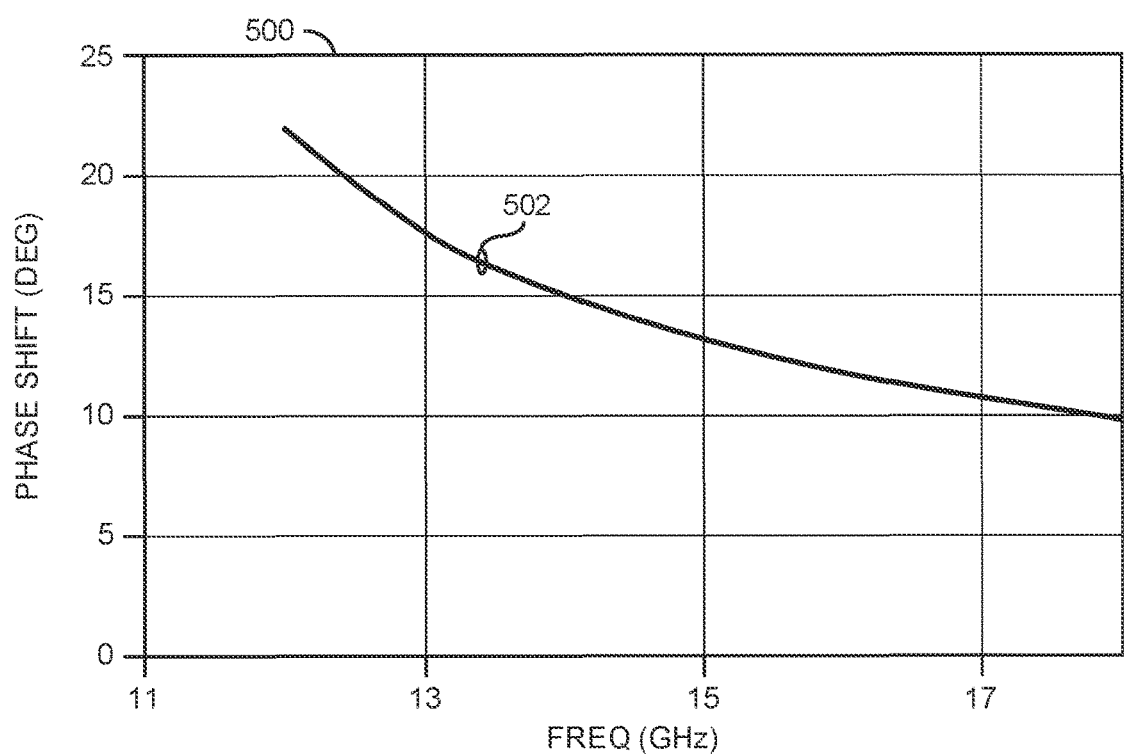

Referring to FIG. 13, a schematic diagram of a circuit 480 is shown illustrating a phase shift circuit implementing the phase shift element 420 of FIG. 9. In an example, the circuit 480 comprises an inductor 482, four capacitors 484, 486, 488, and 490, and two switches 492 and 494. The inductor 482 may have an inductance value (L). The capacitors 484 and 486 may have similar capacitance values (C1). The capacitors 488 and 490 may have similar capacitance values (C2). The capacitors 484 and 486 may be connected in series between an input port and an output port of the phase shifting element circuit 480. The capacitor 488 and the switch 492 may be connected in series across the capacitor 484. The capacitor 490 and the switch 494 may be connected in series across the capacitor 486. The inductor 482 may be connected between the capacitors 484, 486, 488, and 490 with a shunt orientation. In an example, a first terminal of the input port may be connected to a first terminal of the capacitor 424 and a first terminal of the switch 492. A second terminal of the switch 492 may be connected to a first terminal of the capacitor 488. A second terminal of the capacitor 484 may be connected to a first terminal of the inductor 482, a second terminal of the capacitor 488, a first terminal of the capacitor 486, and a first terminal of the switch 494. A second terminal of the switch 494 may be connected to a first terminal of the capacitor 490. A second terminal of the capacitor 486 and a second terminal of the capacitor 490 may be connected to a first terminal of the output port. A second terminal of the input port, a second terminal of the output port, and a second terminal of the inductor 482 may be connected together. The switches 492 and 494 are generally configured to implement the switch between capacitance values C1 (switches 492 and 494 open) and C1+C2 (switches 492 and 494 closed). Referring to FIG. 14, a diagram of a graph 500 is shown illustrating the phase shift behavior of the phase shift element 420 of FIG. 9.

In various embodiments, the switches 462, 464, 492, and 494 may be implemented using a variety of switch types including, but not limited to, CMOS, FET, and HEMT technologies. The phase shift behavior of the phase shift element implementations of FIGS. 7 and 9 differ with respect to frequency. The phase shift provided by the phase shift element 400 of FIG. 7 generally increases as frequency increases (as illustrated by a curve 472 in FIG. 12), while the phase shift provided by the phase shift element 420 of FIG. 9 generally decreases as frequency increases (as illustrated by a curve 502 in FIG. 14).

Figure 15:
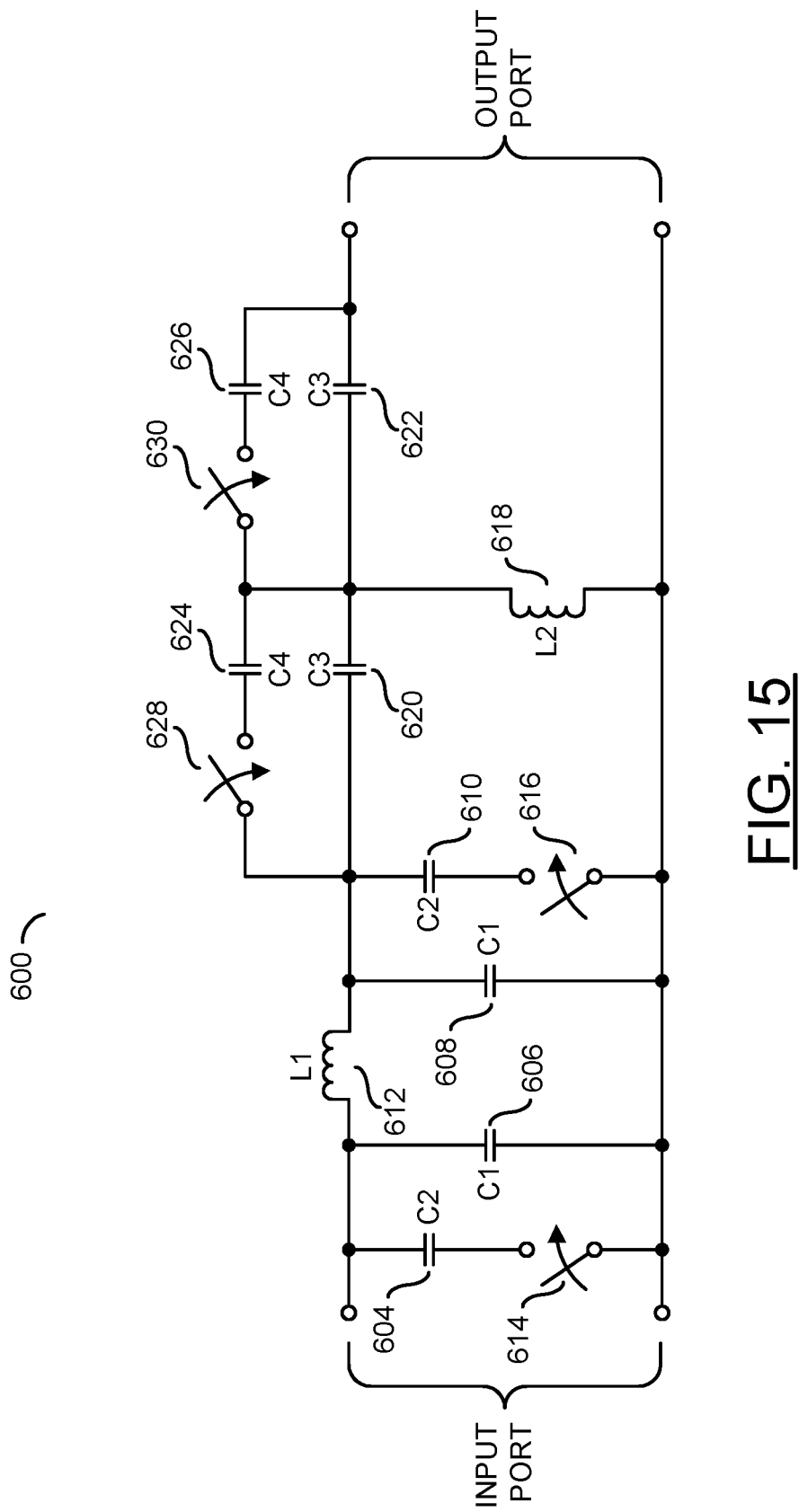
FIG. 15 is a diagram illustrating an example implementation of a phase shifter circuit providing a constant phase shift in accordance with another example embodiment of the invention.
Figure 16:
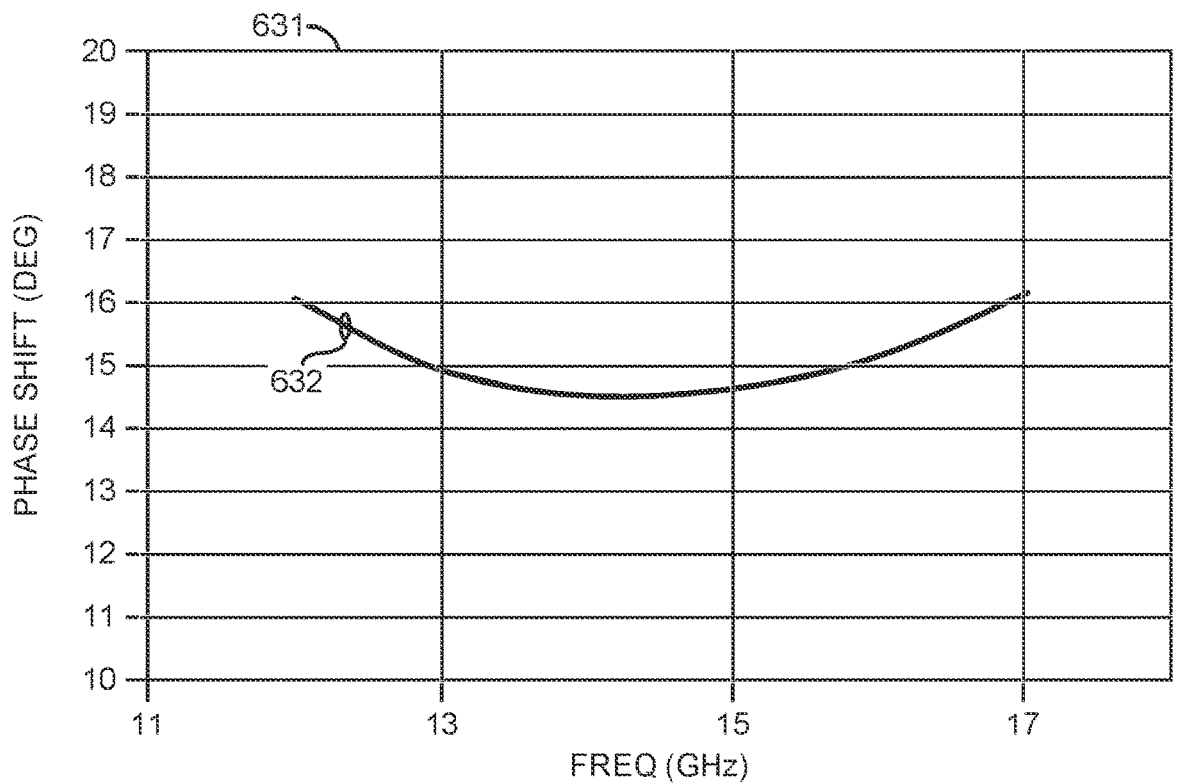
FIG. 16 is a diagram illustrating an example implementation of a constant phase shift.

Referring to FIG. 15, a diagram of a circuit 600 is shown illustrating an example implementation of a phase shift circuit implementing a constant phase shift. In an example, the circuit 600 may comprise the phase shift circuits of FIGS. 11 and 13 concatenated to implement a phase shift circuit topology providing a constant phase shift over a wide frequency range while maintaining a constant characteristic impedance (as illustrated in FIG. 16). Optimum values of respective phase changes $\Delta\theta_1$ and $\Delta\theta_2$ at corresponding frequencies may be found (e.g., using Equations 1-4 above). In an example, the phase change $\Delta\theta_1$ may be implemented as 7.5 degrees at 14.5 GHz and the phase change $\Delta\theta_2$ may be implemented as 7.5 degrees at 14 GHz.

In an example, the circuit 600 comprises a first portion implementing the topology of FIG. 7 and a second portion implementing the topology of FIG. 9. The first portion comprises capacitors 604, 606, 608, 610, an inductor 612, and two switches 614, 616. The second portion comprises an inductor 618, capacitors 620, 622, 624, 626, and two switches 628, 630. The inductor 612 may have an inductance value (L1). The capacitors 606 and 608 may have similar capacitance values (C1). The capacitors 604 and 610 may have similar capacitance values (C2). The inductor 618 may have an inductance value (L2). The capacitors 620 and 622 may have similar capacitance values (C3). The capacitors 624 and 626 may have similar capacitance values (C4). In various embodiments, the switches 614, 616, 628, and 630 may be implemented using a variety of switch types including, but not limited to, CMOS, FET, and HEMT technologies.

An input port of the phase shifting element 600 may be connected in parallel to the capacitor 604 and the capacitor 606. The inductor 612 may be connected in series between the capacitor 604, the capacitor 606, the capacitor 608, and the capacitor 610. In an example, a first terminal of the input port may be connected to a first terminal of the capacitor 604, a first terminal of the capacitor 606, and a first terminal of the inductor 612. A second terminal of the inductor 612 may be connected to a first terminal of the capacitor 608, a first terminal of the capacitor 610, a first terminal of the capacitor 620, and a first terminal of the switch 628. A second terminal of the capacitor 604 may be connected to a first terminal of the switch 614. A second terminal of the capacitor 610 may be connected to a first terminal of the switch 616. A second terminal of the switch 628 may be connected to a first terminal of the capacitor 624. A second terminal of the capacitor 620 may be connected to a first terminal of the inductor 618, a second terminal of the capacitor 624, a first terminal of the capacitor 622, and a first terminal of the switch 630. A second terminal of the switch 630 may be connected to a first terminal of the capacitor 626. A second terminal of the capacitor 622 and a second terminal of the capacitor 626 may be connected to a first terminal of the output port. A second terminal of the input port, a second terminal of the output port, a second terminal of the switch 614, a second terminal of the capacitor 606, a second terminal of the capacitor 608, a second terminal of the switch 616, and a second terminal of the inductor 618 may be connected together. The switches 614 and 616 are generally configured to implement the switch between capacitance values C1 (switches 614 and 616 open) and C1+C2 (switches 614 and 616 closed). The switches 628 and 630 are generally configured to implement the switch between capacitance values C3 (switches 628 and 630 open) and C3+C4 (switches 628 and 630 closed).

Referring to FIG. 16, a graph 631 is shown illustrating an example implementation of a constant phase shift. A curve 632 illustrates a combined phase change provided by the concatenation of the two phase shift circuit topologies of FIGS. 7 and 9. Optimum values of respective phase change values $\Delta\theta 1$ and $\Delta\theta 2$ at corresponding frequencies may be found (e.g., using Equations 1-4 above). In an example, the phase change $\Delta\theta 1$ may be implemented as 7.5 degrees at 14.5 GHz and the phase change $\Delta\theta 2$ may be implemented as 7.5 degrees at 14 GHz to produce a substantially constant phase shift over a frequency range of 13 GHz to 15 GHz.

Figure 17:
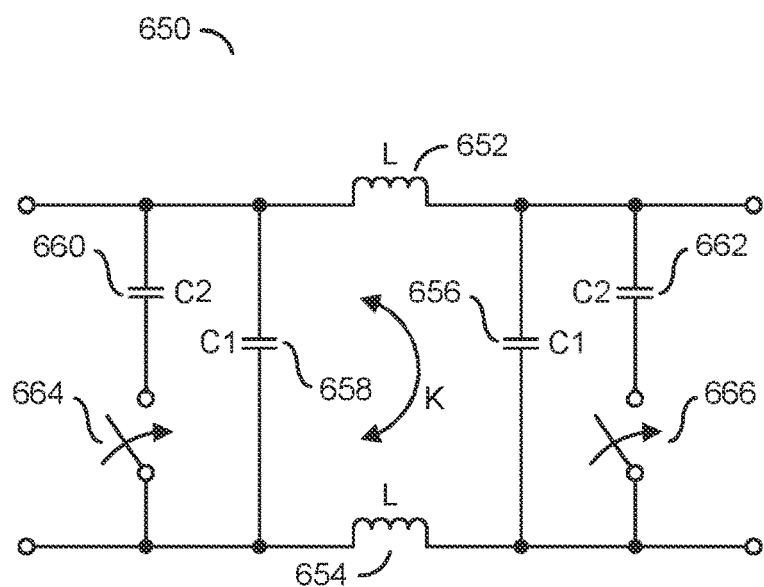
FIG. 17 is a diagram illustrating a differential phase shifter circuit in accordance with another example embodiment of the invention.

Referring to FIG. 17, a diagram of a circuit 650 is shown illustrating a differential phase shifter circuit in accordance with another example embodiment of the invention. Any of the topologies described above may be implemented for differential signaling as well. For example, the circuit 650 may be implemented using the phase shifter circuit of FIG. 11 having two series inductors. In an example, the circuit 650 may comprise a first inductor 652, a second inductor 654, a first capacitor 656, a second capacitor 658, a third capacitor 660, a fourth capacitor 662, a switch 664, and a switch 666. The inductors 652 and 654 may have similar inductance values (L). The capacitors 656 and 658 may have similar capacitance values (C1). The capacitors 660 and 662 may have similar capacitance values (C2).

In an example, a first terminal of an input port of the circuit 650 may be connected to a first terminal of the capacitor 660, a first terminal of the capacitor 658, and a first terminal of the inductor 652. A second terminal of the inductor 652 may be connected to a first terminal of the capacitor 656, a first terminal of the capacitor 662, and a first terminal of an output port of the circuit 650. A second terminal of the input port may be connected to a first terminal of the switch 664, a second terminal of the capacitor 658, and a first terminal of the inductor 654. A second terminal of the switch 664 may be connected to a second terminal of the capacitor 660. A second terminal of the inductor 654 may be connected to a second terminal of the capacitor 656, a first terminal of the switch 666, and a second terminal of an output port of the circuit 650. A second terminal of the switch 666 may be connected to a second terminal of the capacitor 662.

In some embodiments, the circuit 650 may be configured to implement a differential phase shifter circuit where the two series inductors 652 and 654 are implemented as a transformer with a coupling factor of K. Due to the differential nature, the mutual coupling may be used to implement higher inductance values with lower numbers of turns and associated loss. At the same time, values of the capacitors 656, 658, 660, and 662 may be implemented having one-half the capacitance values of the single-ended version (two capacitors in series), which also results in lower loss associated with the capacitors.

Figure 18:
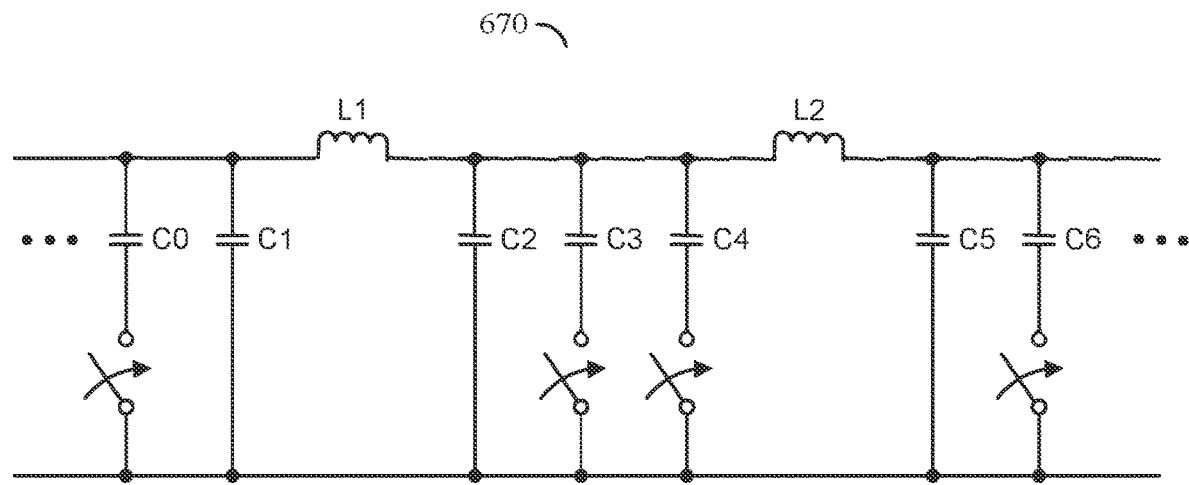
FIGS. 18 and 19 are diagrams illustrating multi-state phase shifter circuits in accordance with an example embodiment of the invention.
Figure 19:
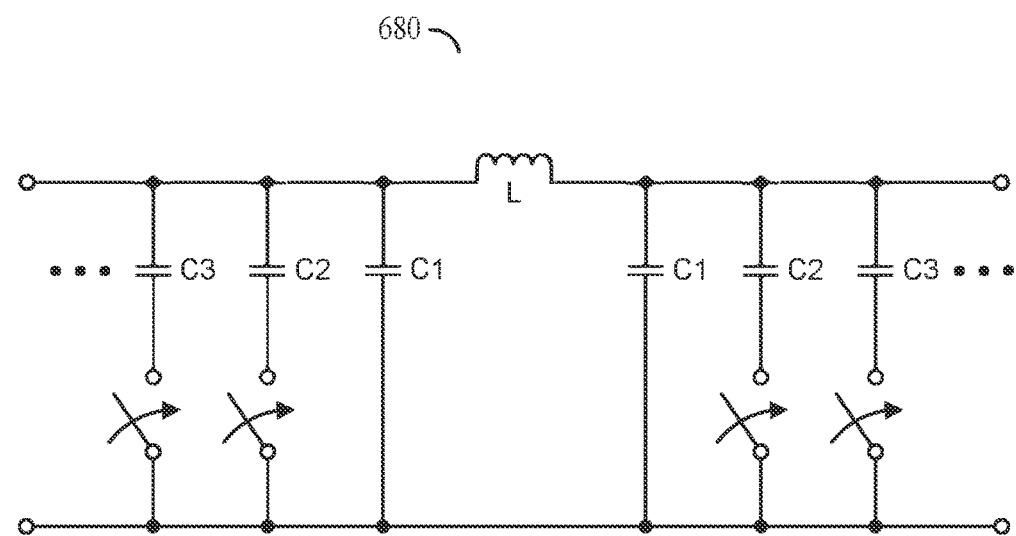

Referring to FIGS. 18 and 19, diagrams are shown illustrating example implementations of two multi-state phase shifter circuits 670 and 680 in accordance with example embodiments of the invention. Since the characteristic impedance of the phase shifting elements described above remains constant over different phase states, a number of the phase shifting elements may be cascaded to implement multi-state phase shifters. In an example, the multi-state phase shifter circuit 680 may be implemented with a common inductor between multiple capacitor stages, with only the capacitances being switched in and out. The multi-state phase shifter circuit 680 is generally more efficient than the multiple inductor variation 670 of FIG. 18. The multi-state phase shifter circuit 680 generally minimizes the number of inductors and, therefore, reduces the chip area and insertion loss significantly. In an example, a tri-state phase shifter circuit may be implemented where the characteristic impedance in the C1+C2 and C1+C3 modes may be made equal, but slightly different from the C1 mode.

Figure 20:
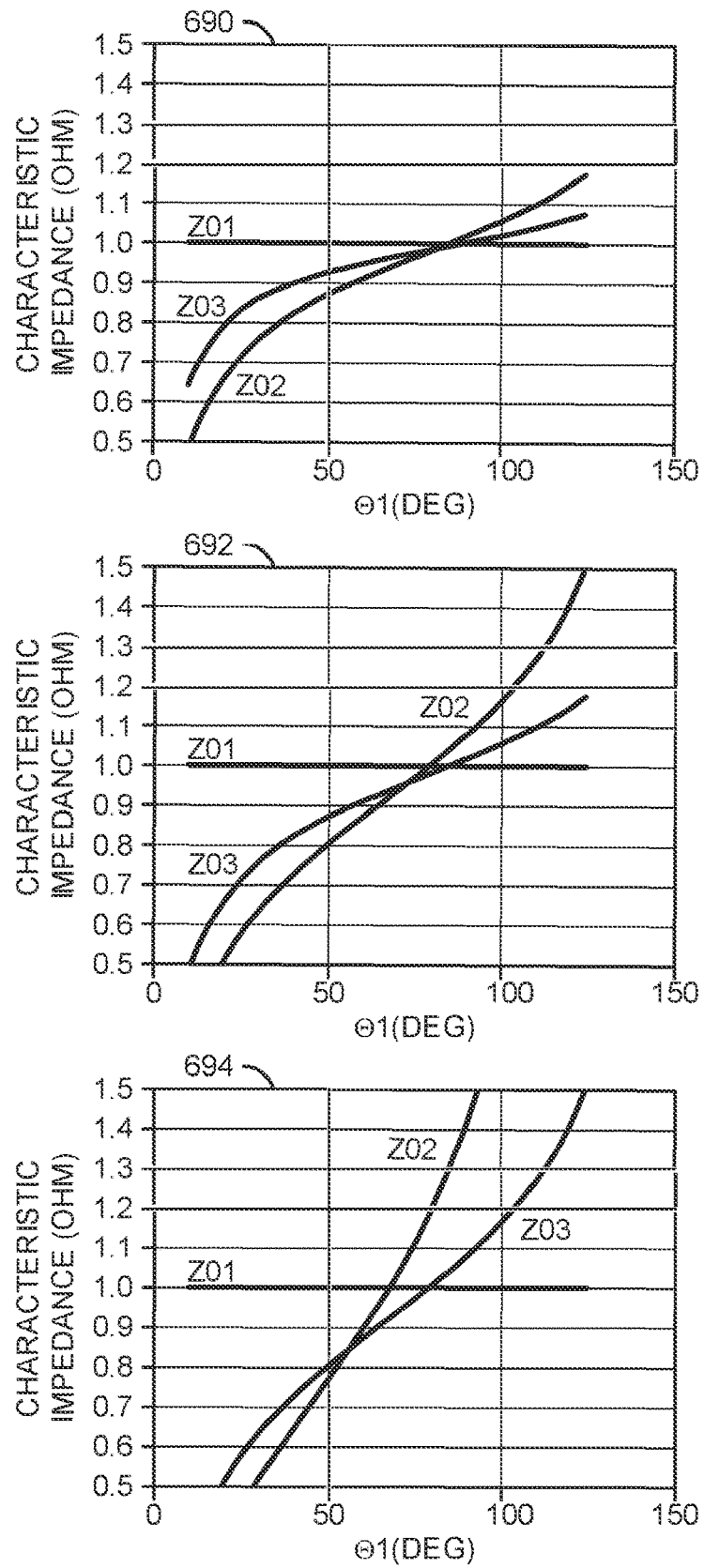
FIG. 20 is a diagram illustrating a tri-state phase shifter circuit in accordance with another example embodiment of the invention.

Referring to FIG. 20, a diagram is shown illustrating variations in characteristic impedance with phase shift of a tri-state phase shifter implemented with the circuit topology of FIG. 19. A graph 690 illustrates a variation of 0.88% in $Z_0$ (instead of remaining constant as desired) for phase shifts of $\Delta\theta=0$, 5.625, and 11.25 degrees at 14 GHz. A graph 692 illustrates a variation of 3.5% in $Z_0$ for phase shifts of $\Delta\theta=0$, 11.25, and 22.5 degrees at 14 GHz. A graph 694 illustrates a variation of 15.3% in $Z_0$ for phase shifts of $\Delta\theta=0$, 22.5, and 45 degrees at 14 GHz. As illustrated in graphs 690, 692, and 694, the variation generally increases as the amount of phase shift increases.

Figure 21:
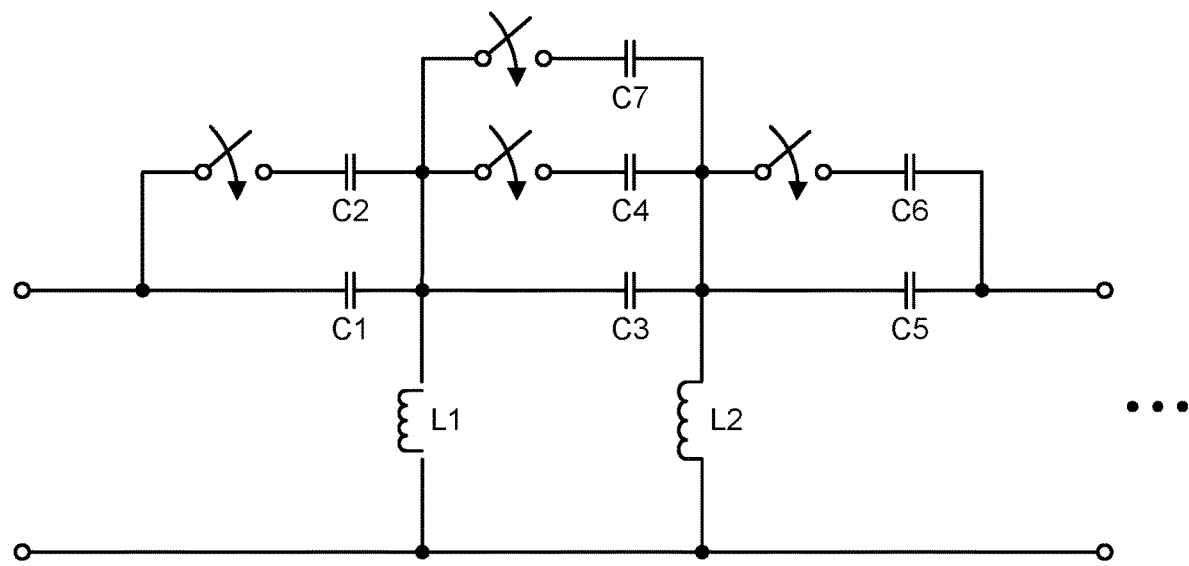
FIGS. 21-22 are diagrams illustrating additional multi-state phase shifter circuits in accordance with an example embodiment of the invention.
Figure 22:
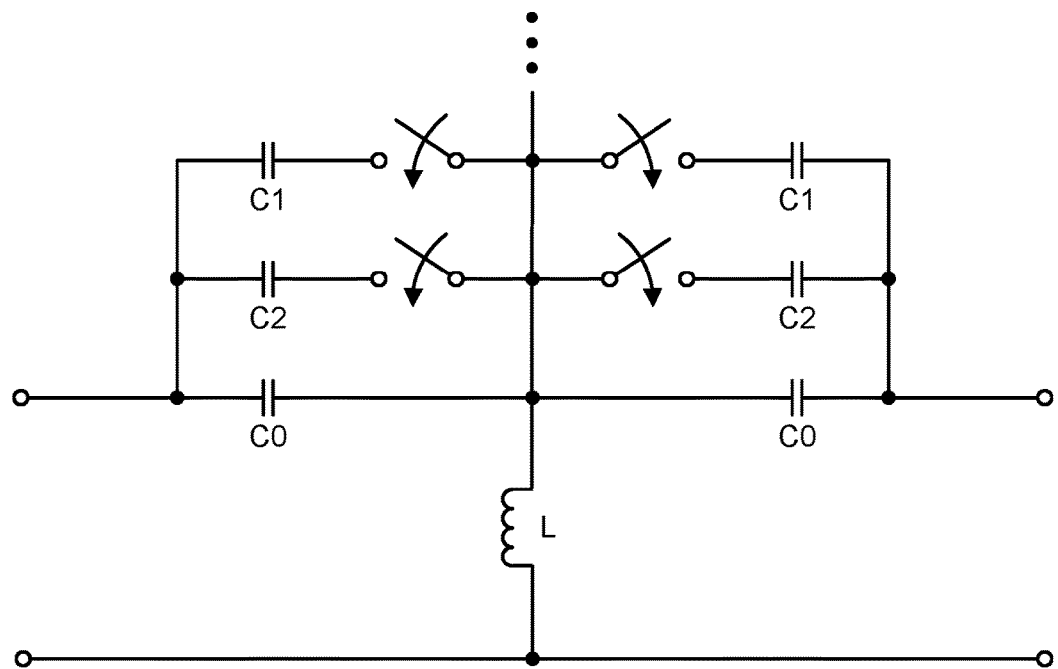

Referring to FIGS. 21 and 22, diagrams are shown illustrating additional examples of multi-state phase shifter circuit implementations in accordance with example embodiments of the invention.

Figure 23:
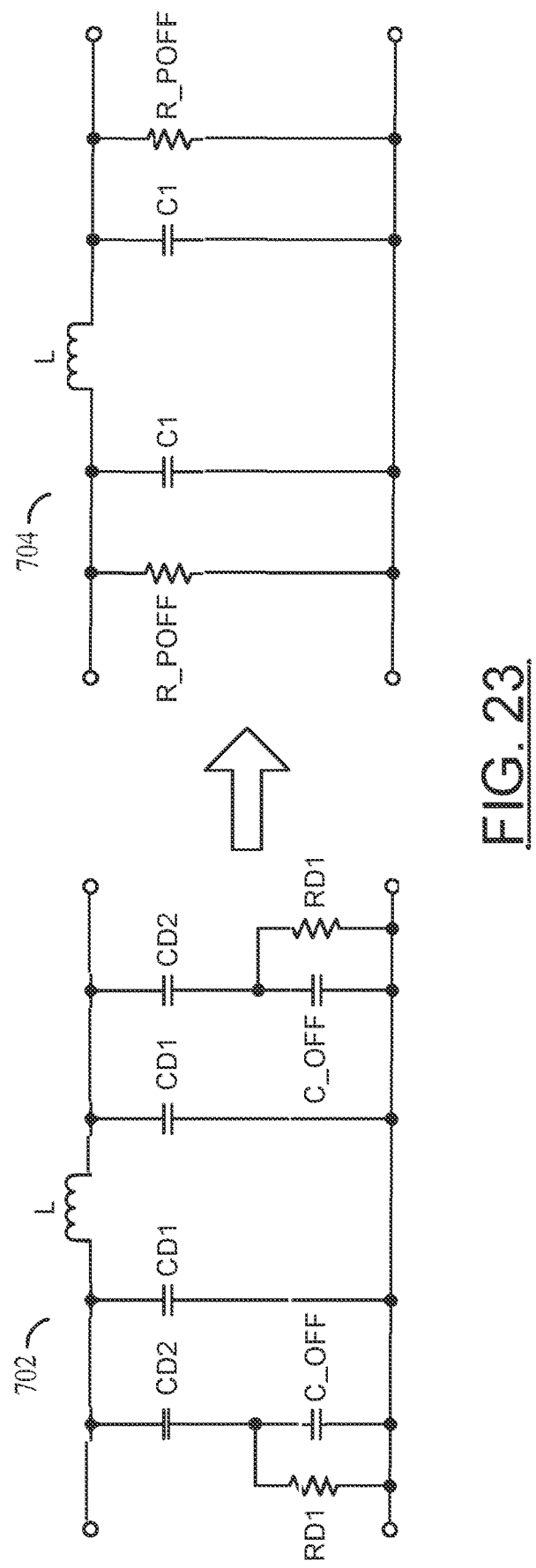
FIGS. 23 and 24 are diagrams illustrating a process of designing a phase shifter circuit taking effects of non-ideal switches into account.
Figure 24:
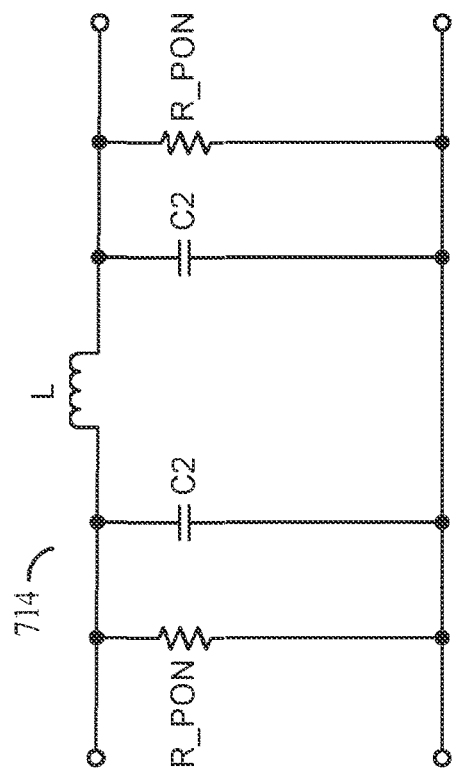
Figure 24:
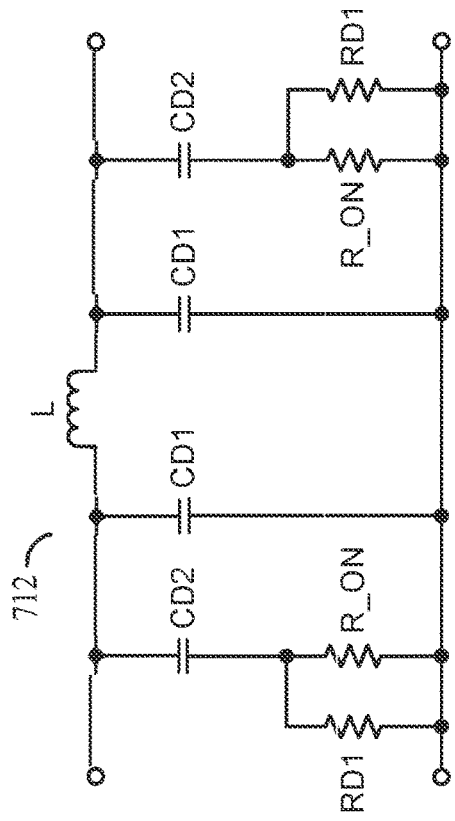

Referring to FIGS. 23 and 24, diagrams are shown illustrating a process of designing a phase shifter circuit in accordance with another example embodiment of the invention. In various embodiments, the phase shifting elements may be designed taking into account effects of non-ideal switches. In an example using the phase shifter topology of FIG. 11, a parasitic capacitance (e.g., $C_{OFF}$) of the switches in an OFF state and the finite on-resistance (e.g., $R_{ON}$) of the switches in an ON state may be included in the design equations. A model of the phase shifter topology of FIG. 11 with the switches in the OFF state is generally illustrated as the circuits 702 and 704 in FIG. 23. A model of the phase shifter topology of FIG. 11 with the switches in the ON state is generally illustrated as a circuits 712 and 714 in FIG. 24. A resistance $R_{d1}$ may be externally added in shunt with the switches to produce similar effect of on-resistance in the OFF state.

In FIG. 24, a value $R_{Pon}$ appears in the ON state due to the finite on-resistance of the switches. In FIG. 23, a value $R_{Poff}$ may be added to produce similar effect (e.g., $R_{Poff}$) in the OFF state. The values of $C_{d1}$, $C_{d2}$, and $R_{d1}$ may be extracted from Equations 5-11 below. Taking the parasitic capacitance and on-resistance of the switches in the phase shifter circuit into account generally enables implementation of the phase shifter circuits in accordance with embodiments of the invention even when the switches have excess capacitance and on-resistance.

In various embodiments, the OFF state may be expressed using the following Equations 5-8:

$$Q_{OFF} = R_{d1} \times C_{OFF} \times \omega \quad \text{EQ. 5}$$

$$Q' = \frac{C_{OFF}(1 + Q_{OFF}^2) + C_{d2}Q_{OFF}^2}{C_{OFF} \times C_{d2} \times R_{d1} \times \omega} \quad \text{EQ. 6}$$

$$C_1 = C_{d1} + \frac{C_{OFF}(1 + Q_{OFF}^2)C_{d2}}{C_{OFF}(1 + Q_{OFF}^2) + C_{d2}Q_{OFF}^2} \times \frac{Q'^2}{1 + Q'^2} \quad \text{EQ. 7}$$

$$R_{POFF} = \frac{R_{d1}}{1 + Q_{OFF}^2} \times (1 + Q'^2) \quad \text{EQ. 8}$$

The ON state may be expressed using the following Equations 9-11:

$$Q_{ON} = \frac{1}{C_{d2}(R_{d1} \| R_{ON})\omega} \quad \text{EQ. 9}$$

$$R_{Pon} = (R_{d1} \| R_{on})(1 + Q_{ON}^2) \quad \text{EQ. 10}$$

$$C_2 = C_{d1} + \frac{C_{d2}}{1 + C_{d2}^2(R_{d1} \| R_{on})^2 \omega^2}. \quad \text{EQ. 11}$$

Figure 25:
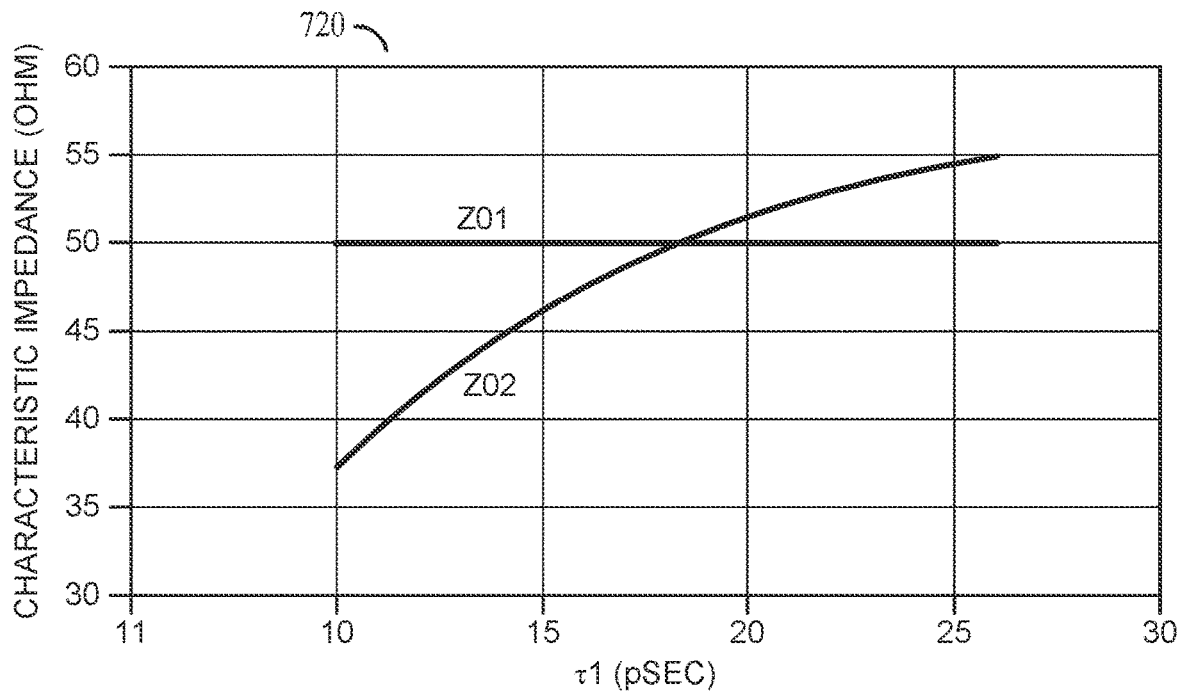
FIG. 25 is a diagram illustrating a group delay shifting circuit in accordance with another example embodiment of the invention.

Referring to FIG. 25, a diagram of a graph 720 is shown illustrating a design process in accordance with an example embodiment of the invention for a group delay shift. The negative derivative of phase shift with respect to frequency is referred to as group delay. Group delay is utilized to describe pass band characteristics of a filter. A group delay measurement generally shows how much a device causes frequency components to become misaligned. In general, a device with constant group delay is desirable for minimal distortion.

The same topologies described above may be designed to achieve a desired group delay ($\tau = -\partial\phi/\partial\omega$) instead of phase shift ($\Delta\theta$), without affecting the characteristic impedance and, therefore, insertion loss. Variable group delay is particularly of interest in broadband and pulsed phase array systems. In an example using the topology of FIG. 7, the characteristic impedance ($Z_0$) and relative delay ($\tau$) may be summarized in the following Equations 12 and 13:

$$z_0 = \frac{\tau}{2C} \quad \text{EQ. 12}$$

$$\tau = \sqrt{\frac{4LC}{2 - LC\omega^2}} \quad \text{EQ. 13}$$

The design procedure is similar to the one described above in connection with FIG. 7. The idea is to change the capacitance value of C from a first value (e.g., C1) to a second value (e.g., C2) and achieve a given change in group delay, $\Delta\tau$, without affecting the characteristic impedance $Z_0$.

In an example, a design process may begin by selecting a first group delay value (e.g., $\tau1$) and calculating the capacitance C1 using Equation 12. Choosing a desired first impedance value (e.g. $Z_{01}$) to be equal to the characteristic impedance (e.g. $Z_{01}=Z_0$), the inductance value L may be found using Equation 13. With the value L determined, the design process may continue by determining a second group delay value (e.g., $\tau2$) by adding the desired group delay change to the first group delay value (e.g., $\tau2=\tau1+\Delta\tau$), and calculating the corresponding capacitance value C2 using Equation 13. Then, a second impedance value (e.g., $Z_{02}$) may be obtained using Equation 12. Because the only arbitrary selection is the first group delay value $\tau1$, the process generally continues by determining the first group delay value $\tau1$ that ensures that $Z_{02}=Z_{01}$.

In an example, the determination of the first group delay value $\tau1$ may be done analytically or simply by iteration as illustrated in the graph 720 of FIG. 25. A first curve 722 illustrates the first impedance value $Z_{01}$ over a range of magnitudes of the first group delay value $\tau1$. A second curve 724 illustrates the second impedance value $Z_{02}$ over the range of magnitudes of the first group delay value $\tau1$. In an example with a desired group delay change of 10 picoseconds (e.g., $\Delta\tau$=10 ps at 14 GHz), $\tau 1$=18.5 ps generally ensures $Z_{02}$=$Z_{01}$=50 ohms. The values for L, C1, and C2 may be determined as 556.5 pH, 185 fF, and 283.8 fF, respectively.

Figure 26:
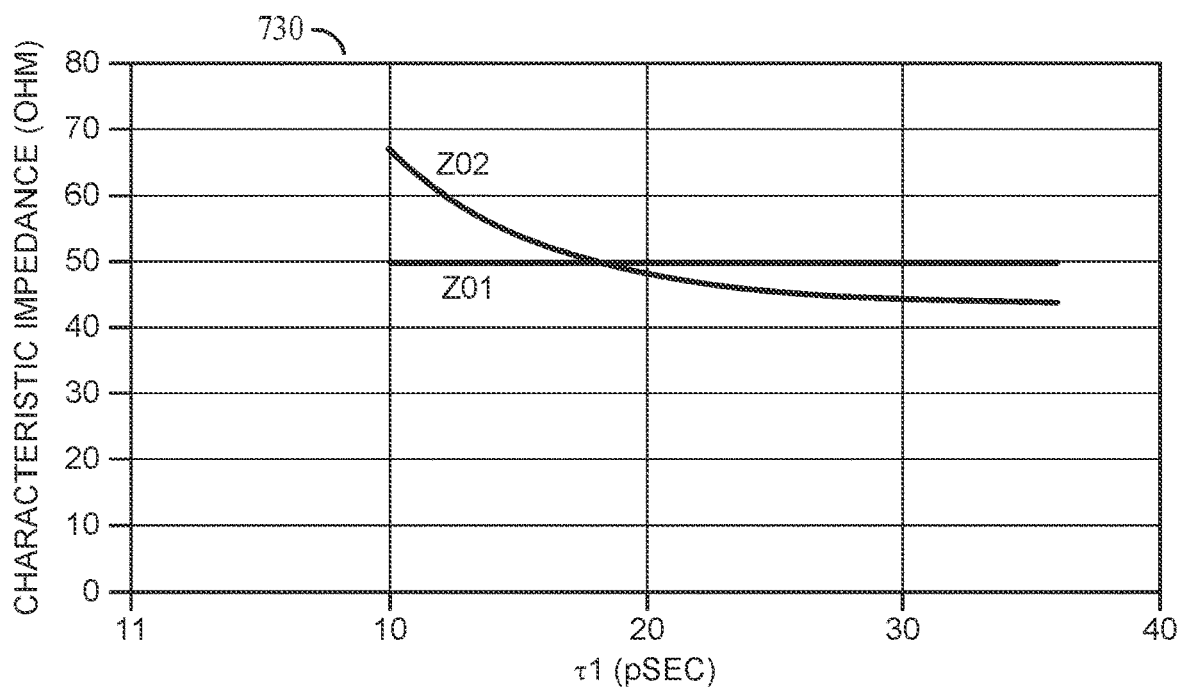
FIG. 26 is a diagram illustrating another group delay shifting circuit in accordance with another example embodiment of the invention.

Referring to FIG. 26, a diagram of a graph 730 is shown illustrating another example design process for a group delay shift. In an example using the topology of FIG. 9, the characteristic impedance ($Z_0$) and relative delay ($\tau$) may be summarized in the following Equations 14 and 15:

$$z_0 = \frac{2}{\tau C \omega^2} \quad \text{EQ. 14}$$

$$\tau\omega = \sqrt{\frac{4}{2LC\omega^2 - 1}}. \quad \text{EQ. 15}$$

The design procedure is similar to the one described above in connection with FIG. 25. The idea is to change the capacitance value of C from the first capacitance value C1 to the second capacitance value C2 and achieve a desired change in group delay, $\Delta\tau$, without affecting the characteristic impedance $Z_0$.

In an example, a design process may begin by selecting a first group delay value (e.g., $\tau 1$) and calculating the capacitance value C1 using Equation 14. Choosing a desired first impedance value (e.g. $Z_{01}$) to be equal to the characteristic impedance (e.g. $Z_{01}$=$Z_0$), the inductance value L may be found using Equation 15. With the inductance value L determined, the design process may continue by determining a second group delay value (e.g., $\tau 2$) by adding the desired group delay change (or shift) to the first group delay value (e.g., $\tau 2$=$\tau 1$+$\Delta\tau$), and calculating the capacitance value C2 using Equation 15. Then, a second impedance value (e.g., $Z_{02}$) may be obtained using Equation 14. Because the only arbitrary selection is the first group delay value $\tau 1$, the process generally continues by determining the first group delay value $\tau 1$ that ensures that $Z_{02}$=$Z_{01}$.

In an example, the determination of the first group delay value $\tau 1$ may be done analytically or simply by iteration as illustrated in the graph 730 of FIG. 26. A first curve 732 illustrates the first impedance value $Z_{01}$ over a range of magnitudes of the first group delay value $\tau 1$. A second curve 734 illustrates the second impedance value $Z_{02}$ over the range of magnitudes of the first group delay value $\tau 1$. In an example with a desired group delay change of 10 picoseconds (e.g., $\Delta\tau$=10 ps at 14 GHz), $\tau 1$=18.25 ps generally ensures $Z_n$=$Z_{01}$=50 ohms. The values for L, C1, and C2 may be determined as 582.2 pH, 283.3 fF, and 182.9 fF, respectively.

Figure 27:
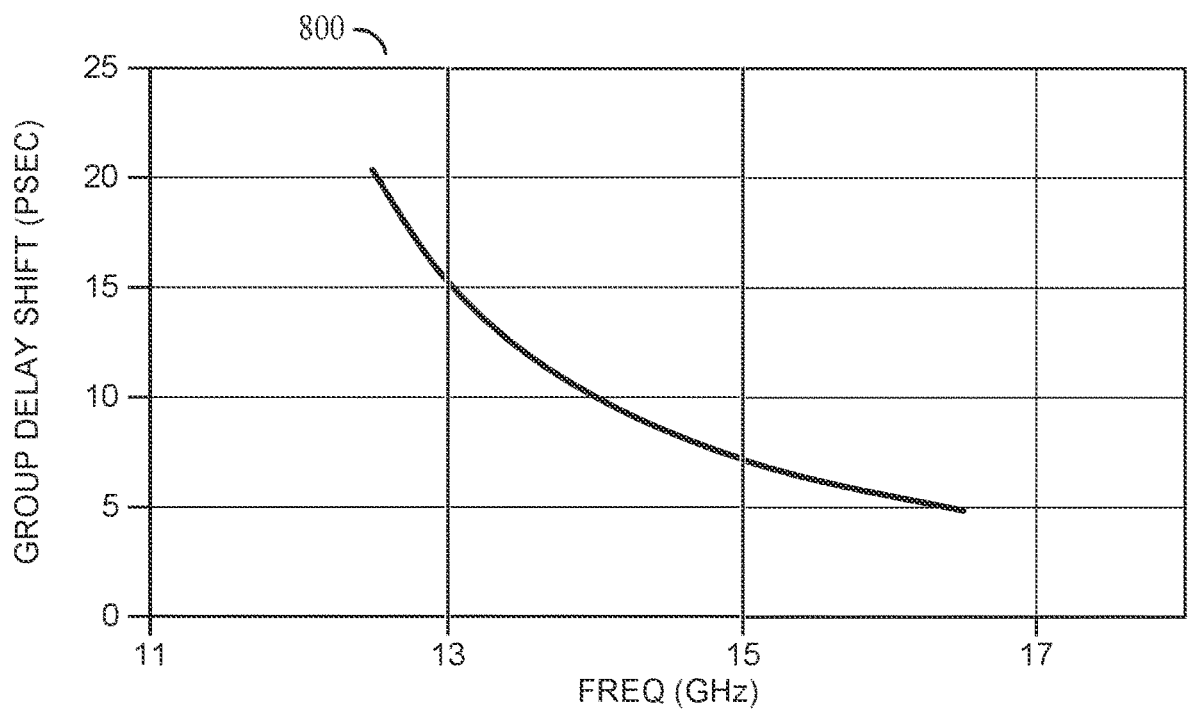
FIG. 27 is a diagram illustrating a group delay shifting circuit in accordance with another example embodiment of the invention.
Figure 28:
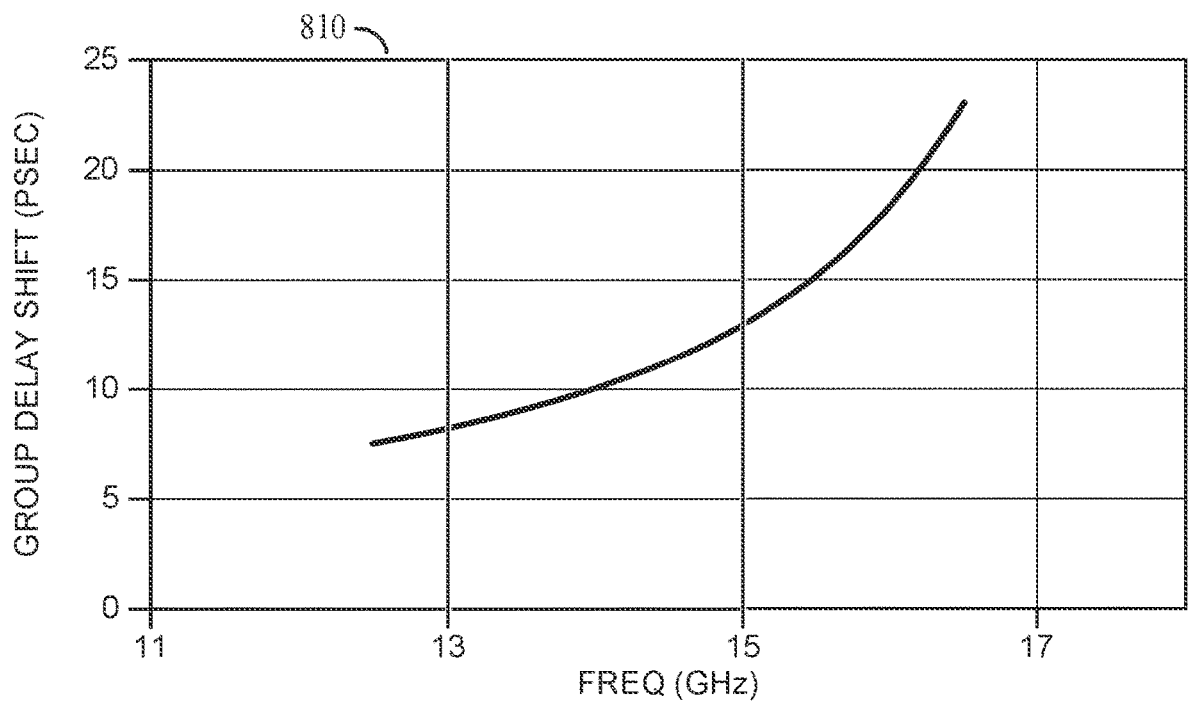
FIG. 28 is a diagram illustrating another group delay shifting circuit in accordance with another example embodiment of the invention.

Referring to FIGS. 27 and 28, graphs are shown illustrating the group delay shift behaviors of the circuit topologies of FIG. 7 and FIG. 9, respectively. The group delay shift behavior of the circuit topology 400 of FIG. 7 is illustrated by a graph 800 (FIG. 27). The group delay shift behavior of the circuit topology 420 of FIG. 9 is illustrated by a graph 810 (FIG. 28). The group delay shift behaviors of the circuit topologies 400 and 420 are different with respect to frequency. A curve 802 illustrates that the group delay shift of the circuit topology 400 of FIG. 7 decreases with frequency, while a curve 812 illustrates that the group delay shift of the circuit topology 420 of FIG. 9 increases with frequency. The difference in group delay shift behavior of the two circuit topologies may be efficiently exploited to implement a constant phase shift over a wider frequency range while maintaining a constant characteristic impedance.

Figure 29:
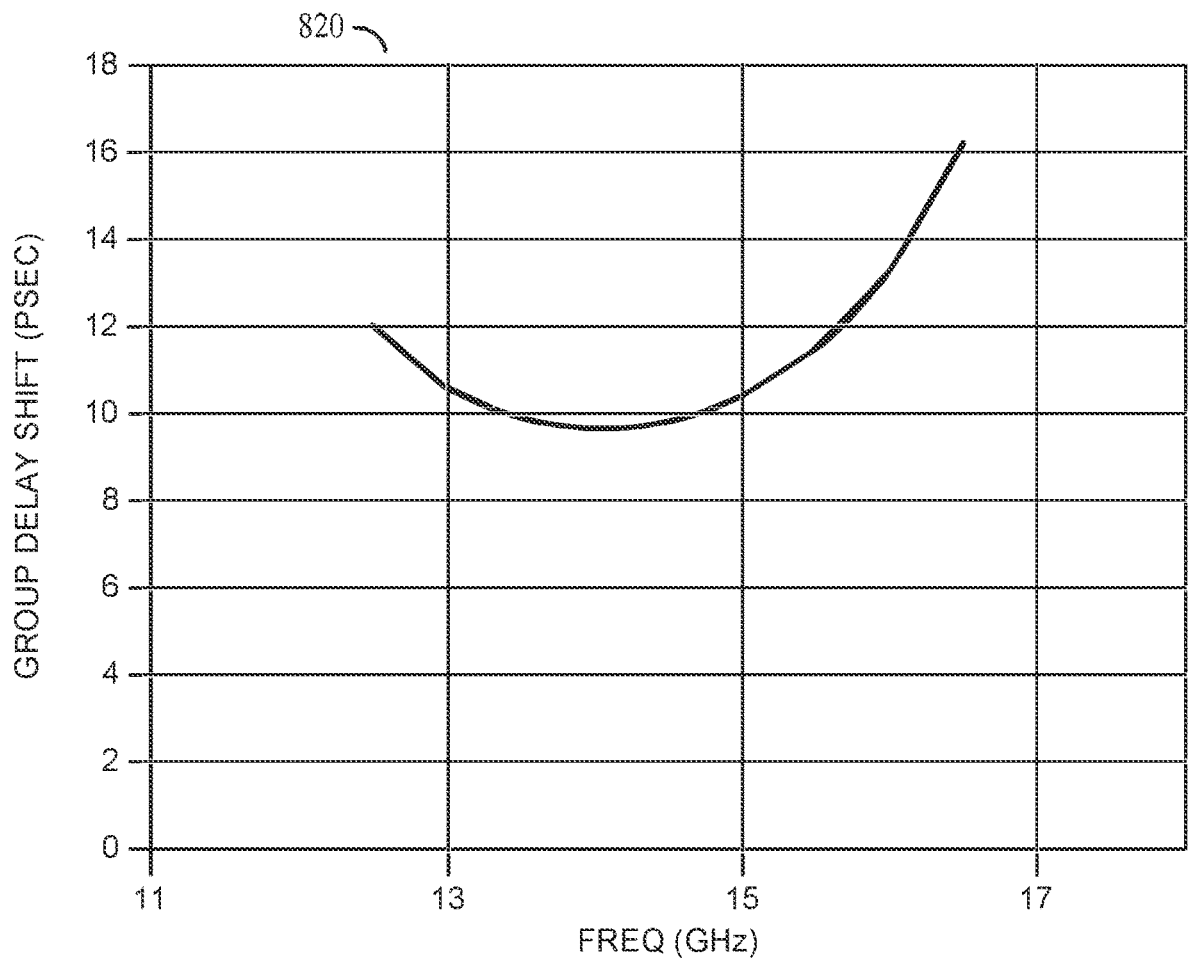
FIG. 29 is a diagram illustrating another group delay shifting circuit in accordance with another example embodiment of the invention.

Referring to FIG. 29, a diagram of a graph 820 is shown illustrating the group delay shift behavior of the circuit topology 600 of FIG. 15, which combines the circuit topologies 400 and 420. In an example, the phase shift circuit 600 of FIG. 15 may comprise the phase shift circuits of FIGS. 11 and 13 concatenated to implement a phase shift circuit topology providing a constant phase shift over a wide frequency range while maintaining a constant characteristic impedance (as illustrated in FIG. 16). Optimum values of group delay shifts $\Delta\tau_1$ and $\Delta\tau_2$ at corresponding frequencies may be found as illustrated by a curve 822 in FIG. 29. In an example for a frequency range of 13 GHz to 15 GHz, the group delay shifts $\Delta\tau_1$ and $\Delta\tau_2$ of the concatenated phase shift circuits may be 4 ps at 14 GHz and 5 ps at 13.5 GHz, respectively.

Figure 30:
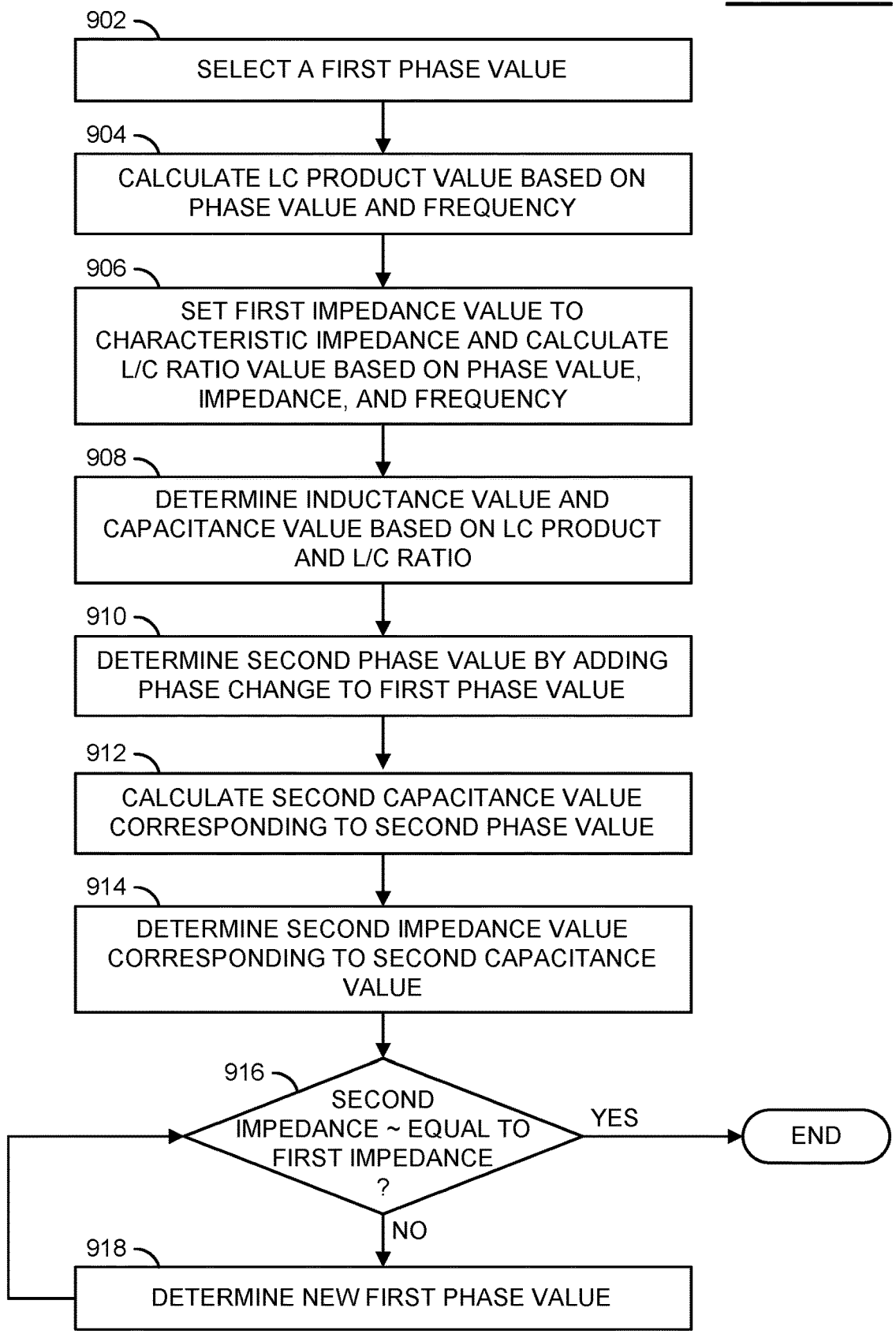
FIG. 30 is a diagram illustrating a design process in accordance with an example embodiment of the invention.

FIG. 30 is a diagram illustrating a design process 900 in accordance with an example embodiment of the invention. In an example, the design process (or method) 900 may comprise a step (or state) 902, a step (or state) 904, a step (or state) 906, a step (or state) 908, a step (or state) 910, a step (or state) 912, a decision step (or state) 914, a step (or state) 916, and a step (or state) 918. In the step 902, the process 900 may begin by selecting a first phase value (e.g., $\theta 1$) and moving to the step 904. In the step 904, the process 900 may calculate an LC product (e.g., $LC_A$) using Equation 1. In the step 906, the process 900 may set a desired first impedance value (e.g. $Z_{01}$) to be equal to the characteristic impedance (e.g. $Z_{01}$=$Z_0$) and calculate an L/C ratio (e.g., $L/C_A$) using Equation 2. In the step 908, the process 900 determines the values L and $C_A$. The design process 900 may continue in the step 910 by determining a second phase value (e.g., $\theta 2$) by adding the desired phase change to the first phase value (e.g., $\theta 2$=$\theta 1$+$\Delta\theta$), and moving to the step 912. In the step 912, the process 900 may calculate a second capacitance value (e.g., $C_B$) using Equation 1. In the step 914, the process 900 may determine a second impedance vale (e.g., $Z_{02}$). Since the value L is not changed, the second impedance value $Z_{02}$ is now fixed and not necessarily equal to the first impedance value $Z_{01}$. In the decision step 916, the process 900 determines whether the second impedance value is approximately equal to the first impedance value. If not, the process 900 moves to the step 918. Because the only arbitrary selection is the first phase value $\theta 1$, the process 900 generally loops through the steps 916 and 918 determining the first phase value $\theta 1$ that ensures that $Z_{02}$=$Z_{01}$. When the process 900 determines the second impedance value is approximately (or substantially) equal to the first impedance value, the process 900 ends. In an example, the determination of the first phase value $\theta 1$ may be done analytically or simply by iteration as illustrated above in connection with FIG. 8.

Figure 31:
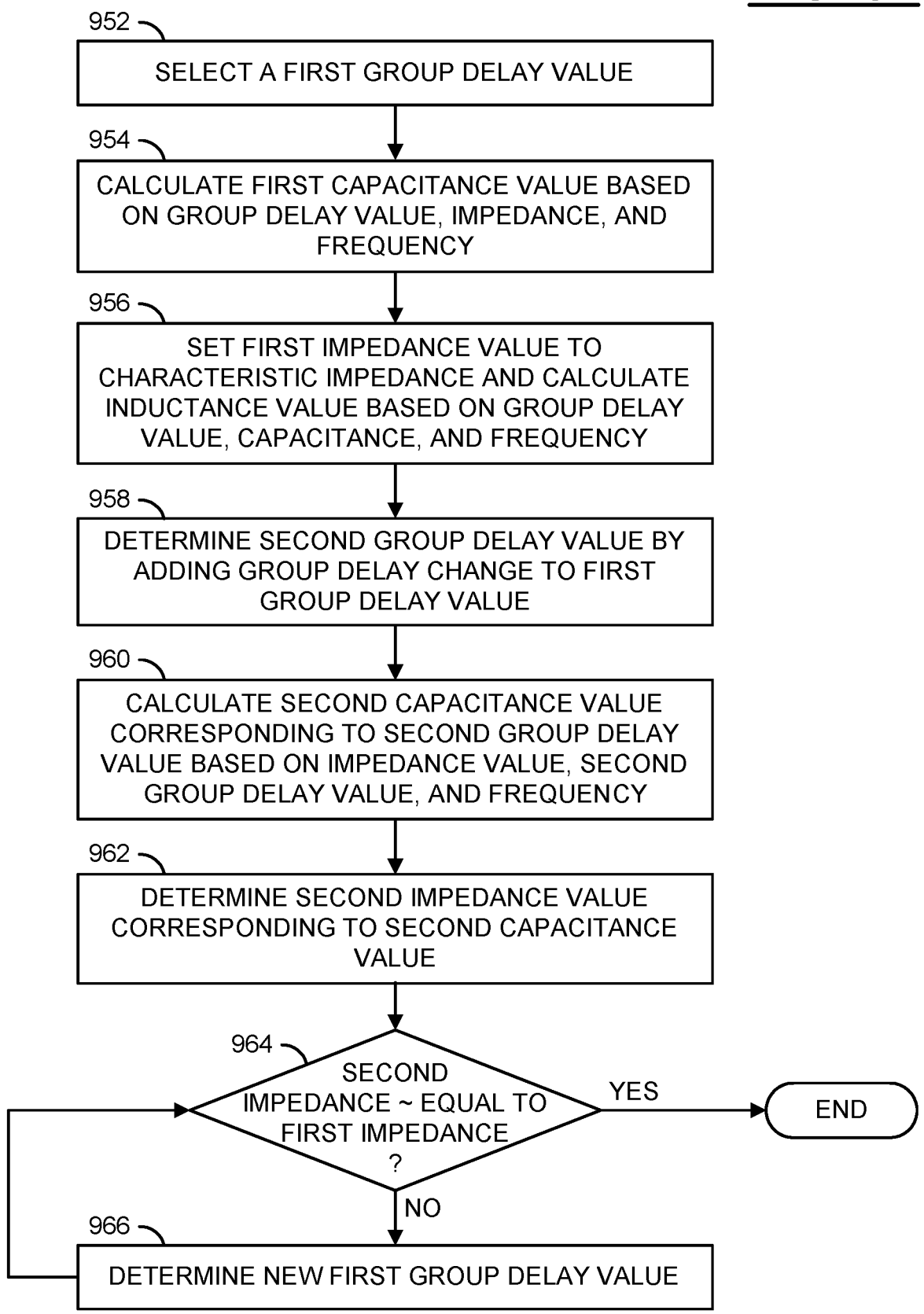
FIG. 31 is a diagram illustrating a design process in accordance with another example embodiment of the invention.

FIG. 31 is a diagram illustrating a design process 950 in accordance with another example embodiment of the invention. In an example, the design process (or method) 950 may comprise a step (or state) 952, a step (or state) 954, a step (or state) 956, a step (or state) 958, a step (or state) 960, a step (or state) 962, a decision step (or state) 964, and a step (or state) 966. In the step 952, the process 950 may begin by selecting a first group delay value (e.g., $\tau 1$) and moving to the step 954. In the step 954, the process 950 may calculate a first capacitance value (e.g., C1) using Equation 14. In the step 956, the process 959 may set a desired first impedance value (e.g. $Z_{01}$) to be equal to the characteristic impedance (e.g. $Z_{01}$=$Z_0$) and calculate the inductance value L using Equation 15. In the step 958, with the inductance value L determined, the design process 950 may continue by determining a second group delay value (e.g., $\tau 2$) by adding the desired group delay change (or shift) to the first group delay value (e.g., $\tau_2=\tau_1+\Delta\tau$), and move to the step 960. In the step 960, the process 950 may calculate a second capacitance value (e.g., C2) using Equation 15. In the step 962, the process 950 may determine a second impedance value (e.g., $Z_{02}$) using Equation 14. In the decision step 964, the process 950 determines whether the second impedance value is approximately equal to the first impedance value. If not, the process 950 moves to the step 966. Because the only arbitrary selection is the first group delay value $\tau_1$, the process 950 generally loops through the steps 964 and 966 determining the first group delay value $\tau_1$ that ensures that $Z_{02}=Z_{01}$. When the process 950 determines the second impedance value is approximately (or substantially) equal to the first impedance value, the process 950 ends. In an example, the determination of the first group delay value $\tau_1$ may be done analytically or simply by iteration as illustrated in the graph 730 of FIG. 26.

The functions and structures illustrated in the diagrams of FIGS. 1 to 31 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

Although embodiments of the invention have been described in the context of a 5G application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The use of letters (e.g., 112a-112m, ADD1-ADD (X), RF1-RFN, etc.) intended to indicate that any number of the corresponding index may be implemented while staying within the scope of the invention. The letters should not be construed as requiring particular relationships or relative magnitudes between the various labels in which the letters are used. The number of elements specified using letters may be different or similar. In an example, the hard-wired address ADD1-ADD (X) may be implement as 6 bits while the number antenna input/outputs (or transceiver channels) RF1-RFN may be implemented as 4. In another example, the hard-wired address ADD1-ADD (X) may be implemented as six bits while the number antenna input/outputs (or transceiver channels) RF1-RFN may be implemented as eight.

While the invention has been particularly shown and described with reference to embodiments thereof, it will be understood by those skilled in the art that various changes in form and details may be made without departing from the scope of the invention.

The invention claimed is:
1. An apparatus comprising:
a plurality of transceiver circuits, each transceiver circuit comprising a phase shifter circuit, wherein the phase shifter circuit includes an inductive-capacitive (LC) network that includes an inductor connected to a first capacitor and a second capacitor, and the phase shifter circuit is configured to:
receive a control signal; and
in response to the receipt of the control signal, switch the second capacitor into the phase shifter circuit to change a capacitance value of the LC network from a first capacitance value to a second capacitance value, wherein the change to the capacitance value of the LC network causes a phase shift to be performed by the phase shifter circuit,
wherein:
the first capacitance value prior to the change is a predetermined capacitance value of the first capacitor;
the second capacitance value subsequent to the change is a sum of the first capacitance value and a predetermined capacitance value of the second capacitor;
an inductance value of the inductor, the predetermined capacitance value of the first capacitor, and the predetermined capacitance value of the second capacitor, are predetermined based on a relationship between a characteristic impedance and a phase of the phase shifter circuit;
based on the predetermined inductance value, the predetermined capacitance value of the first capacitor, and the predetermined capacitance value of the second capacitor, and in response to the phase shift, the characteristic impedance of the phase shifter circuit is maintained at an original value in response to the change from the first capacitance value to the second capacitance value in order to reduce variation in input and output impedances of the phase shifter circuit;

the LC network is a first LC network;

the inductor in the first LC network is a first inductor;

the phase shifter circuit further includes a second LC network connected to the first LC network;

the second LC network includes a second inductor connected to a first pair of identical capacitors and a second pair of identical capacitors;

the second inductor is placed in shunt;

the first pair of identical capacitors and the second pair of capacitors are in series relative to input and output ports of the phase shifter circuit; and the second pair of capacitors is parallel to the first pair of capacitors.

2. The apparatus according to claim 1, wherein the phase shifter circuit is bidirectional.

3. The apparatus according to claim 1, wherein the phase shifter circuit is implemented in at least one of a single-ended format and a differential format.

4. The apparatus according to claim 1, wherein the (LC) network in the phase shifter circuit comprises one or more switches configured to switch the capacitance value from the first capacitance value to the second capacitance value, and the one or more switches are implemented using at least one of complementary metal oxide semiconductor (CMOS), field effect transistor (FET), and high electron mobility transistor (HEMT).

5. The apparatus according to claim 1, wherein the first capacitor and the second capacitor are parallel capacitors configured to provide a plurality of phase shifts.

6. The apparatus according to claim 1, wherein the first and second LC networks in the phase shifter circuit are among a plurality of LC networks, each LC network among the plurality of LC networks comprising at least one inductor and at least one capacitor.

7. The apparatus according to claim 1, wherein the phase shifter circuit comprises a transformer.

8. The apparatus of claim 1, wherein the phase shifter circuit is among a plurality of phase shifter circuits in a transceiver circuit of a radio-frequency (RF) transceiver system.

9. The apparatus of claim 1, wherein the phase shifter circuit is among one of a transmission chain and a receiver chain of a transceiver circuit of a radio-frequency (RF) transceiver system.

10. The apparatus of claim 1, wherein the phase shift is a phase change from a first phase value to a second phase value, and the second capacitance value varies with the first phase value.

11. The apparatus according to claim 1, wherein the first capacitor and the second capacitor form a first set of parallel capacitors connected to a first terminal of the first inductor, and the LC network further comprises a third capacitor and a fourth capacitor that form a second set of parallel capacitors connected to a second terminal of the first inductor, wherein the first capacitor and third capacitor are identical, and the second capacitor and the fourth capacitor are identical.

* * * * *